United States Patent
Ge et al.

(10) Patent No.: US 9,252,149 B2
(45) Date of Patent: Feb. 2, 2016

(54) DEVICE INCLUDING ACTIVE FLOATING GATE REGION AREA THAT IS SMALLER THAN CHANNEL AREA

(75) Inventors: Ning Ge, Singapore (SG); Adam L. Ghozeil, Corvallis, OR (US); Chaw Sing Ho, Singapore (SG); Trudy Benjamin, Portland, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/375,695

(22) PCT Filed: Apr. 30, 2012

(86) PCT No.: PCT/US2012/035892
§ 371 (c)(1),
(2), (4) Date: Jul. 30, 2014

(87) PCT Pub. No.: WO2013/165375
PCT Pub. Date: Nov. 7, 2013

(65) Prior Publication Data
US 2014/0374812 A1    Dec. 25, 2014

(51) Int. Cl.
*H01L 27/115* (2006.01)
*H01L 29/788* (2006.01)
*G11C 16/04* (2006.01)
*H01L 21/28* (2006.01)
*H01L 21/288* (2006.01)
*H01L 21/3213* (2006.01)
*H01L 29/10* (2006.01)
*H01L 29/423* (2006.01)
*H01L 29/66* (2006.01)

(52) U.S. Cl.
CPC ...... *H01L 27/11517* (2013.01); *G11C 16/0425* (2013.01); *H01L 21/288* (2013.01); *H01L 21/28158* (2013.01); *H01L 21/32133* (2013.01); *H01L 27/1156* (2013.01); *H01L 27/11521* (2013.01); *H01L 27/11524* (2013.01); *H01L 29/1033* (2013.01); *H01L 29/42324* (2013.01); *H01L 29/66825* (2013.01); *H01L 29/7881* (2013.01); *H01L 29/7884* (2013.01)

(58) Field of Classification Search
CPC .......... H01L 27/11536; H01L 29/788; H01L 29/7884; H01L 27/11524; H01L 27/11526; H01L 27/11517
USPC ........................................................ 257/316
See application file for complete search history.

(56) References Cited

U.S. PATENT DOCUMENTS

| | | | |
|---|---|---|---|
| 4,868,629 A * | 9/1989 | Eitan | 257/316 |
| 5,280,446 A * | 1/1994 | Ma et al. | 365/185.15 |
| 5,414,287 A | 5/1995 | Hong | |
| 5,414,693 A * | 5/1995 | Ma et al. | 365/185.1 |
| 5,460,988 A | 10/1995 | Hong | |
| 5,482,879 A * | 1/1996 | Hong | 438/264 |
| 5,483,094 A * | 1/1996 | Sharma et al. | 257/316 |
| 5,510,639 A | 4/1996 | Okuda et al. | |
| 5,939,749 A | 8/1999 | Taketa et al. | |

(Continued)

*Primary Examiner* — Nathan Ha
(74) *Attorney, Agent, or Firm* — Dicke, Billig & Czaja, PLLC (PAT)

(57) ABSTRACT

A device including a drain, a channel, a floating gate, and a control gate. The channel surrounds the drain and has a channel area. The floating gate includes an active floating gate region that has an active floating gate region area. The control gate is coupled to the active floating gate region via a control capacitance, wherein the active floating gate region area is smaller than the channel area.

11 Claims, 16 Drawing Sheets

(56) References Cited

U.S. PATENT DOCUMENTS

| | | |
|---|---|---|
| 6,060,742 A * | 5/2000 | Chi et al. .................. 257/316 |
| 6,075,267 A * | 6/2000 | Taji et al. .................. 257/316 |
| 6,403,494 B1 | 6/2002 | Chu et al. |
| 6,750,506 B2 * | 6/2004 | Noda et al. ................ 257/328 |
| 7,872,296 B2 * | 1/2011 | Okamura .................... 257/315 |
| 2007/0034922 A1 | 2/2007 | Bhattacharyya |
| 2009/0085090 A1 | 4/2009 | Nagai |
| 2013/0114343 A1 * | 5/2013 | Chiu et al. ................ 365/185.18 |
| 2013/0329498 A1 * | 12/2013 | Villavelez et al. ........ 365/185.15 |
| 2014/0218436 A1 * | 8/2014 | Ge et al. ......................... 347/19 |
| 2014/0264532 A1 * | 9/2014 | Dennison et al. ............. 257/316 |

* cited by examiner

DEVICE INCLUDING ACTIVE FLOATING GATE REGION AREA THAT IS SMALLER THAN CHANNEL AREA

BACKGROUND

In inkjet printheads, fuse technology has been used in N-channel metal-oxide semiconductor (NMOS) chips. In these chips, fuses are selectively burned to program a bit. However, fuse technology and programming fuses in this way has drawbacks. Fuses are relatively large and can be unreliable. Also, burning fuses can damage the orifice layer of the inkjet during programming and, after a fuse is burned out, metal debris from the fuse can be drawn into the ink and cause blockage in the inkjet pen, resulting in poor quality printing.

In recent years, electronically programmable read-only memory (EPROM) devices have been developed. These EPROM devices include a conductive grid of rows and columns, without fuses. Instead, a memory cell is located at each row/column intersection. Each memory cell includes a transistor structure and two gates that are separated from each other by a thin dielectric layer. One of the gates is a floating gate and the other is a control gate or input gate. In an unprogrammed memory cell, the floating gate has no charge, which causes the threshold voltage to be low. In a programmed memory cell, the floating gate is charged with electrons and the threshold voltage is higher. To program a memory cell, a programming voltage (e.g., 10 to 16 volts) is applied to the control gate and drain. The programming voltage draws excited electrons to the floating gate, thereby increasing the threshold voltage. A memory cell having a lower threshold voltage is one logic value and a memory cell having a higher threshold voltage is the other logic value.

To read the state of an EPROM cell, row and column select transistors are biased on in a series path of the EPROM cell. The resistance of the EPROM cell, which indicates the logic value of the EPROM cell, is read via the row and column select transistors. Higher EPROM resistances reduce signal to noise ratios and improve reliability.

For these and other reasons, a need exists for the present invention.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that features of the various embodiments described herein may be combined with each other, unless specifically noted otherwise.

Figure 1:
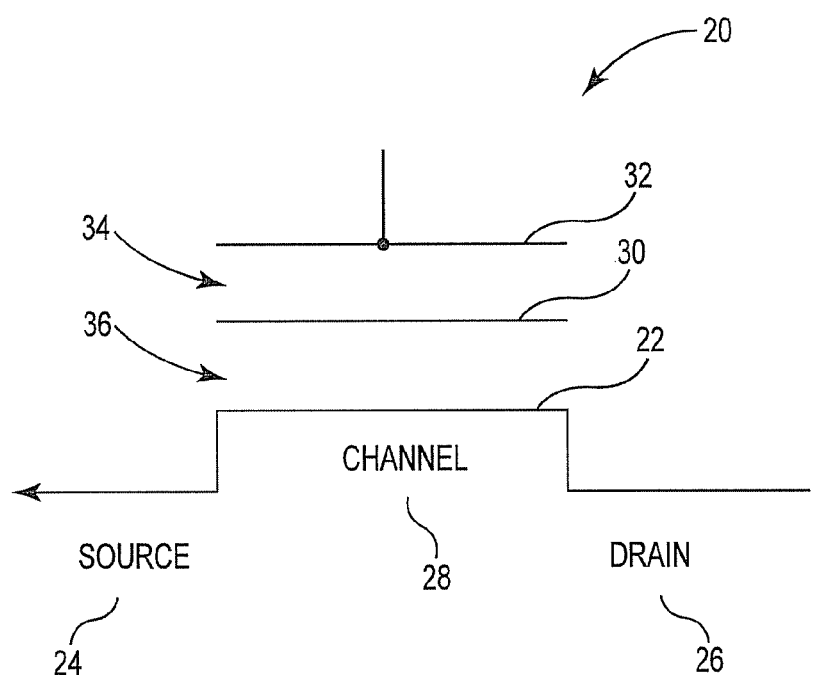
FIG. 1 is a diagram illustrating one example of an EPROM cell.

FIG. 1 is a diagram illustrating one example of an EPROM cell 20 that provides a higher and tunable on-resistance Ron and an increased control gate capacitance to floating gate capacitance ratio for improved EPROM performance and smaller standard deviations in the programmed on-resistance Ron. EPROM cells, such as EPROM cell 20, can be used in systems, such as inkjet printhead systems.

EPROM cell 20 includes a semiconductor substrate 22 having a source 24, a drain 26, and a channel 28, where channel 28 is situated between source 24 and drain 26. A floating gate 30 is situated over channel 28 and an input gate 32, also referred to as control gate 32, is situated over floating gate 30. Source 24 includes an N+ doped region and drain 26 includes an N+ doped region. Channel 28 is a p doped region situated between the N+ doped regions of source 24 and drain 26.

Control gate 32 is capacitively coupled to floating gate 30 via a control gate capacitance, also referred to as a control capacitance, that includes dielectric material 34 situated between control gate 32 and floating gate 30. A voltage at control gate 32 is coupled to floating gate 30 via the control capacitance. Another layer of dielectric material 36 is disposed between floating gate 30 and substrate 22 over channel 28.

Channel 28 surrounds drain 26 and has a channel area and a channel length to width ratio. Floating gate 30 includes an active floating gate region that has an active floating gate region area and an active floating gate region length to width ratio. In one example, the active floating gate region area is smaller than the channel area. In one example, the active floating gate region length to width ratio is greater than the channel length to width ratio.

To program EPROM cell 20, a high voltage bias is applied to drain 26. This high voltage bias on drain 26 generates energetic "hot" carriers or electrons. A positive voltage bias between control gate 32 and drain 26 pulls some of these hot electrons onto floating gate 30. As electrons are pulled onto floating gate 30, the threshold voltage of EPROM cell 20, i.e., the voltage required to cause channel 28 to conduct current, increases. If enough electrons are pulled onto floating gate 30, the threshold voltage increases to a level above a specified threshold voltage and EPROM cell 20 substantially blocks current at the specified threshold voltage level, which changes the logic state of EPROM cell 20 from one logic value to the other logic value. Thus, EPROM cell 20 is programmed via hot carrier injection onto floating gate 30. In normal operation, a sensor (not shown) is used to detect the state of EPROM cell 20.

Figure 2:
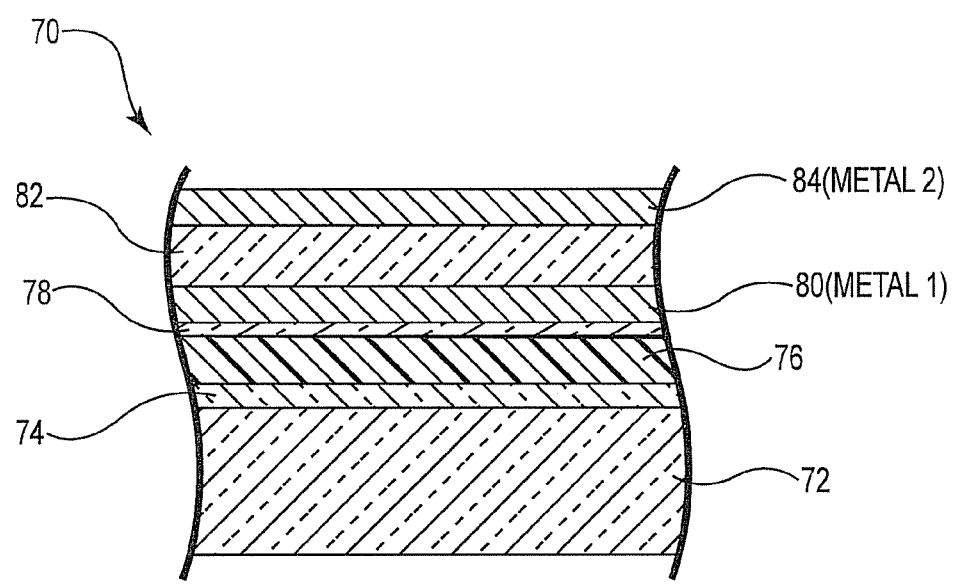
FIG. 2 is a diagram illustrating one example of the layers in an EPROM chip.

FIG. 2 is a diagram illustrating one example of the layers in an EPROM chip 70. In one example, EPROM chip 70 includes EPROM cells such as EPROM cell 20 of FIG. 1. In one example, EPROM chip 70 is used in an inkjet printhead. In one example, EPROM chip 70 is an inkjet control chip including EPROM. In one example, EPROM chip 70 is an inkjet printhead die including EPROM.

EPROM chip 70 includes a semiconductor substrate 72, an oxide layer 74, a polysilicon layer 76, a first dielectric layer 78, a metal 1 layer 80, a second dielectric layer 82, and a metal 2 layer 84. Oxide layer 74 is disposed on substrate 72 between substrate 72 and polysilicon layer 76. First dielectric layer 78 is disposed on polysilicon layer 76 between polysilicon layer 76 and metal 1 layer 80. Second dielectric layer 82 is disposed on metal 1 layer 80 and separates metal 1 layer 80 from metal 2 layer 84. Metal 1 layer 80 and metal 2 layer 84 provide addressing lines, such as row lines and column lines, and other connections in EPROM chip 70. In one example, oxide layer 74 is silicon dioxide (SiO2). In one example, second dielectric layer 82 includes silicon nitride. In one example, second dielectric layer 82 includes silicon carbide. In one example, second dielectric layer 82 includes silicon nitride and silicon carbide.

Figure 3:
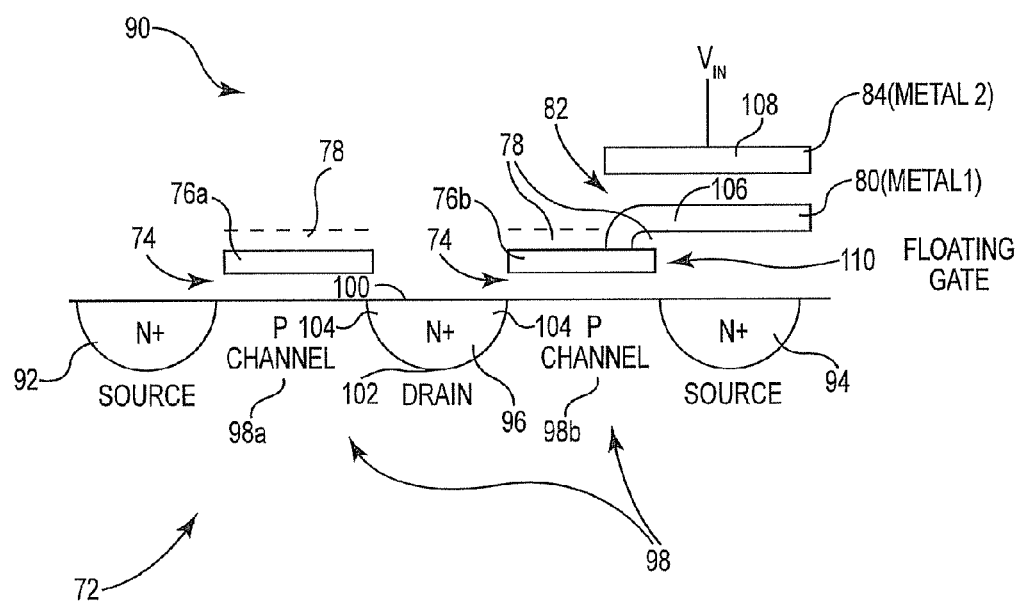
FIG. 3 is a diagram illustrating one example of an EPROM cell that uses the layers of the EPROM chip of FIG. 2.

FIG. 3 is a diagram illustrating one example of an EPROM cell 90 that uses the layers of EPROM chip 70 of FIG. 2. In one example, EPROM cell 20 of FIG. 1 is similar to EPROM cell 90. In one example, EPROM cell 90 is used in an inkjet printhead system. In one example, EPROM cell 90 is used in an inkjet control chip. In one example, EPROM cell 90 is used in an inkjet printhead die. In other examples, EPROM cell 90 is created using the layers of a different process.

EPROM cell 90 includes substrate 72 that has N+ source regions 92 and 94, an N+ drain region 96, and a p channel 98 that includes p channel regions 98a and 98b. Drain region 96 includes a top surface 100, a bottom 102, and sides 104 between top surface 100 and bottom 102. Channel 98, including channel regions 98a and 98b, surrounds drain region 96 around the sides 104 of drain region 96. Channel 98 is situated between source region 92 and drain region 96 and between source region 94 and drain region 96. In one example, source regions 92 and 94 are connected and part of one continuous source region that surrounds channel 98.

Channel 98 includes a closed curve structure around drain region 96, where a curve is defined as an object similar to a line, but not required to be straight, which entails that a line is a special case of a curve, namely a curve with null curvature. Also, a closed curve is defined as a curve that joins up and has no endpoints. In one example, channel 98 includes a rounded closed curve structure around drain region 96, where a rounded closed curve is a closed curve that has at least one rounded or arched corner or no corners, such that it does not have sharp or angled corners. In one example, channel 98, including channel regions 98a and 98b, is a rectangular shaped channel around drain region 96. In one example, channel 98, including channel regions 98a and 98b, is an elliptically shaped channel around drain region 96. In one example, channel 98, including channel regions 98a and 98b, is a circular shaped channel around drain region 96. In one example, channel 98, including channel regions 98a and 98b, has multiple straight sides and at least one rounded corner to form a rounded closed curve channel around drain region 96. In one example, channel 98, including channel regions 98a and 98b, has at least one rounded exterior corner to form a rounded closed curve channel around drain region 96. In one example, channel 98, including channel regions 98a and 98b, has at least one rounded exterior corner and at least one rectangular interior corner to form a rounded closed curve channel around drain region 96.

EPROM cell 90 includes capacitive coupling between metal 1 layer 80 and metal 2 layer 84, where metal 1 layer 80 and metal 2 layer 84 form parallel opposing capacitor plates 106 and 108. One capacitor plate 106 is formed in metal 1 layer 80 and the other capacitor plate 108 is formed in metal 2 layer 84. The capacitor plate 108 formed in metal 2 layer 84 is the control gate 108 of EPROM cell 90. The input voltage Vin is applied to control gate 108 and capacitively coupled to the capacitor plate 106. In one example, control gate 108 is similar to control gate 32 (shown in FIG. 1).

A parallel floating gate 110 is formed in polysilicon layer 76, where floating gate 110 includes polysilicon floating gate regions 76a and 76b situated over channel regions 98a and 98b, respectively. A break or hole in dielectric layer 78 allows capacitor plate 106 in metal 1 layer 80 to be electrically coupled to floating gate 110, including floating gate regions 76a and 76b. Floating gate 110 is separated from substrate 72 by oxide layer 74.

Channel 98 surrounds drain region 96 and has a channel area and a channel length to width ratio. Floating gate 110 includes an active floating gate region that has an active floating gate region area and an active floating gate region length to width ratio. In one example, the active floating gate region area is smaller than the channel area. In one example, the active floating gate region length to width ratio is greater than the channel length to width ratio.

To program EPROM cell 90, a high input voltage pulse is applied to control gate 108 and drain region 96, across drain region 96 to source regions 92 and 94. This generates energetic "hot" carriers or electrons. A positive voltage bias between control gate 108 and drain region 96 pulls some of these hot electrons onto floating gate 110. As electrons are pulled onto floating gate 110, the threshold voltage of EPROM cell 90, i.e., the voltage required to cause channel 98 to conduct current, increases. If enough electrons are pulled onto floating gate 110, the threshold voltage increases to a level above a specified threshold voltage and EPROM cell 90 substantially blocks current at a specified threshold voltage level, which changes the logic state of EPROM cell 90 from one logic value to the other logic value. Thus, EPROM cell 90 is programmed via hot carrier injection onto floating gate 110.

To read or sense the state of EPROM cell 90, the threshold voltage is detected and/or the on resistance is measured using a sensor (not shown). Reading or sensing the state of EPROM cell 90 can be done by setting the gate/drain voltage and measuring the corresponding current or by setting the current and measuring the voltage. The measured on resistance of EPROM cell 90 changes by a factor of about 2 from an un-programmed state to a programmed state.

Figure 4:
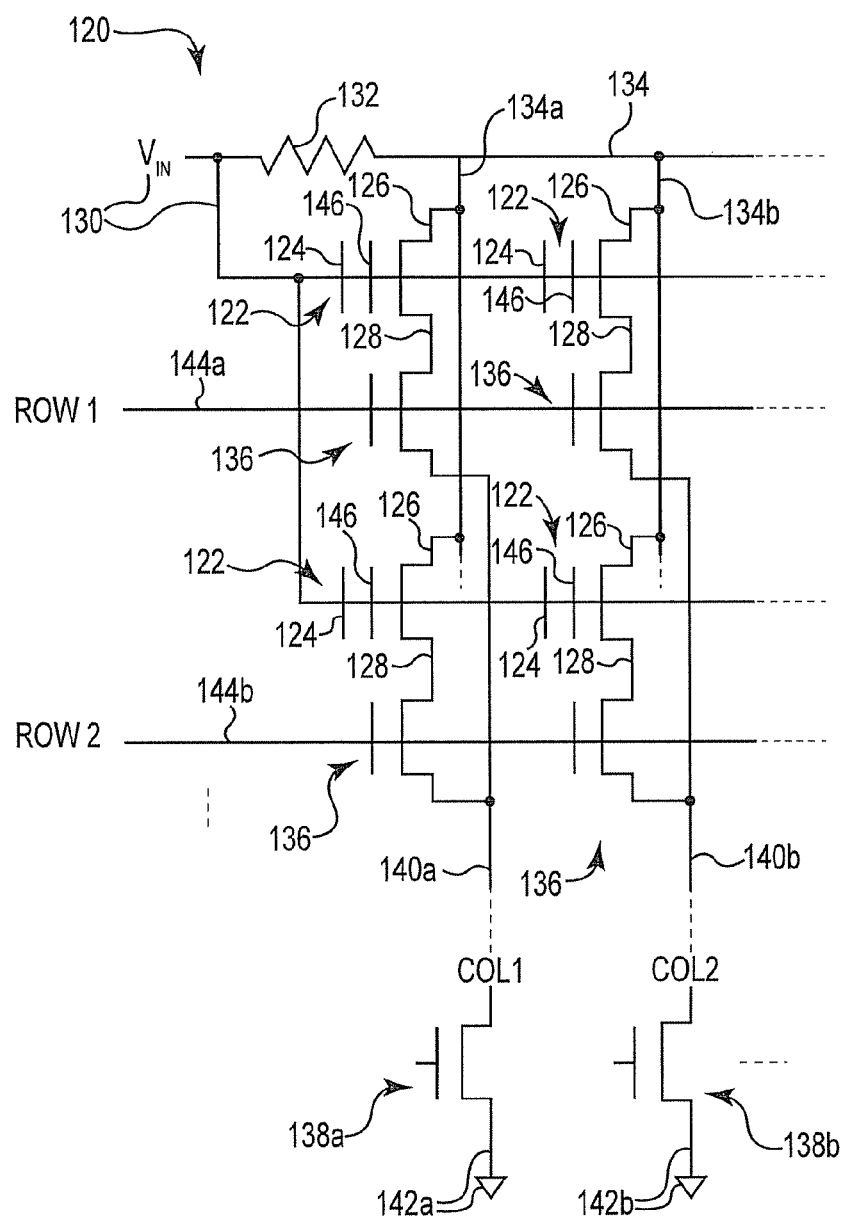
FIG. 4 is a diagram illustrating one example of an EPROM array.

FIG. 4 is a diagram illustrating one example of an EPROM array 120 including EPROM cells 122 arranged in rows and columns. In one example, each of the EPROM cells 122 is similar to EPROM cell 20 of FIG. 1.

Each of the EPROM cells 122 includes a control gate 124, a drain 126, and a source 128. control gates 124 are electrically coupled to input voltage Vin at 130. Drains 126 are electrically coupled together and to series resistor 132 via drain line 134, including drain lines 134a and 134b. The other side of series resistor 132 is electrically coupled to input voltage Vin at 130. Sources 128 are electrically coupled to the drains of row transistors 136, where the sources of row transistors 136 are electrically coupled to the drains of column transistors 138a and 138b via column lines 140a and 140b. The sources of column transistors 138a and 138b are electrically coupled to references at 142a and 142b, such as ground. Row transistors 136 and column transistors 138a and 138b provide selection of EPROM cells 122 for programming and reading.

Row lines 144a and 144b are electrically coupled to the gates of row transistors 136. Row line 144a provides row signal ROW1 at 144a to the gates of row transistors 136 in one row and row line 144b provides row signal ROW2 at 144b to the gates of row transistors 136 in another row. The sources of row transistors 136 in a given column are electrically coupled together and to the drain of one of the column transistors 138a and 138b that corresponds to the given column. The gate of each column transistor 138a and 138b is electrically coupled to a column select signal via a column select line (not shown).

Each of the EPROM cells 122 is programmed by applying a voltage pulse to the control gate 124 and drain 126 of the EPROM cell 122, across drain 126 to source 128 of the EPROM cell 122. This provides hot carriers or electrons to floating gate 146. The time required for programming is a function of at least the floating gate voltage, the quantity of hot electrons drawn to the floating gate, the threshold voltage needed, and the thickness of gate oxide between the substrate and the floating gate. For each of the EPROM cells 122, control gate 124 is coupled to drain 126 via resistor 132 to limit the breakdown current. In one example, resistor 132 has a resistance of 100 ohms.

In one example, the programming voltage across drain 126 to source 128 is close to the breakdown voltage of the EPROM cell 122, where the breakdown voltage is the voltage at which the EPROM cell 122 begins to conduct with its control gate 124 below the threshold voltage, such as zero volts. In one example, an EPROM cell 122 has been programmed at a voltage of about 16V, where the circuit has a breakdown voltage of 15V. In one example, the floating gate voltage is in the range of 5V to 12V. In one example, the threshold voltage is in the range of 3V to 7V.

To read one of the EPROM cells 122, the threshold voltage is detected using a sensor (not shown). Detecting the threshold voltage can be done by setting the gate/drain voltage and measuring the corresponding current or by setting the current and measuring the voltage. The on resistance Ron of the EPROM cell 122 changes by a factor of about 2 from being unprogrammed to being programmed.

To program one of the EPROM cells 122, the EPROM cell 122 is selected by providing a row select voltage to one of the row lines 144a and 144b and a column select voltage to the gate of one of the column transistors 138a and 138b. Next, a relatively high input voltage Vin, such as 16V, is provided at 130. Only the selected EPROM cell 122 has substantially the full input voltage Vin across drain 126 to source 128. All other EPROM cells 122 have source 128 floating to the voltages on the other terminals. To sense the state of a selected EPROM cell 122, a current, such as a 1 milli-ampere current, is provided through the selected EPROM cell 122 and the voltage Vin at 130 is monitored. In another example, to sense the state of a selected EPROM cell 122, a relatively low input voltage pulse Vin, such as 5V, is provided at 130 and the current through the selected EPROM cell 122 is monitored. In other examples, each EPROM cell 122 has a different control transistor coupled to it, where each EPROM cell 122 is selected via one control line coupled to the corresponding control transistor.

Figure 5:
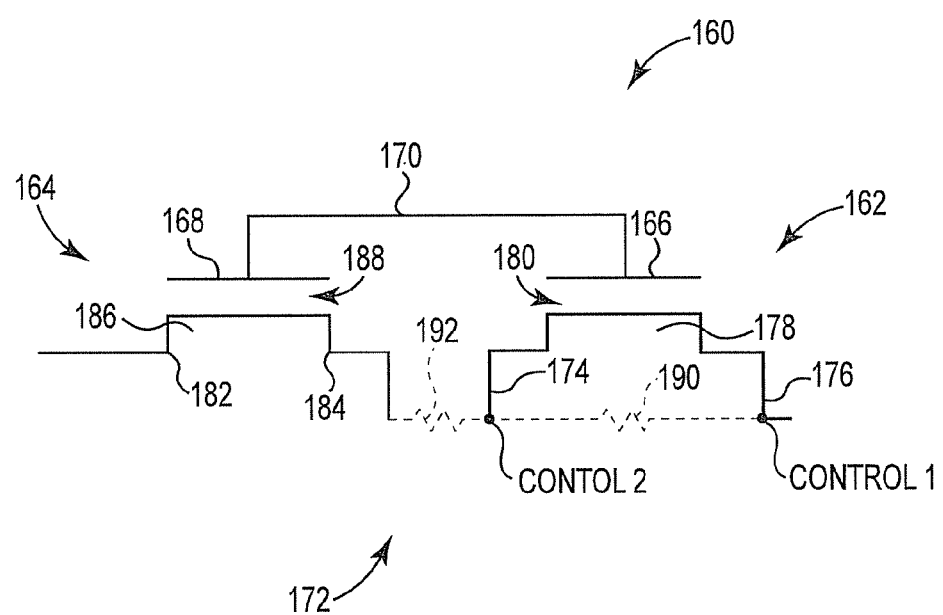
FIG. 5 is a diagram illustrating one example of a gate-coupled EPROM cell that uses the layers of the EPROM chip of FIG. 2.

FIG. 5 is a diagram illustrating one example of a gate-coupled EPROM cell 160 that uses the layers of EPROM chip 70 of FIG. 2. In one example, EPROM cell 20 of FIG. 1 is similar to EPROM cell 160. In one example, EPROM cell 160 is used in an inkjet printhead system. In one example, EPROM cell 160 is used in an inkjet control chip. In one example, EPROM cell 160 is used in an inkjet printhead die. In other examples, EPROM cell 160 is created using the layers of a different process.

EPROM cell 160 includes two devices 162 and 164 having their floating gates 166 and 168 electrically coupled together. First device 162 includes floating gate 166 and second device 164 includes floating gate 168. Floating gate 166 is electrically coupled to floating gate 168 via floating gate connection 170. First device 162 operates as a control gate and second device 164 provides the on-resistance Ron through EPROM cell 160. In one example, floating gates 166 and 168 are made from polysilicon layer 76 (shown in FIG. 2). In one example, floating gate connection 170 is made from metal 1 layer 80 (shown in FIG. 2).

First device 162 includes semiconductor substrate 172 having source 174, drain 176, and channel 178, where channel 178 is situated between source 174 and drain 176. Floating gate 166 is situated over channel 178. Source 174 includes an N+ doped region and drain 176 includes an N+ doped region. Channel 178 is a p doped region situated between the N+ doped regions of source 174 and drain 176. A layer of dielectric material 180 is disposed between floating gate 166 and substrate 172 over channel 178. In one example, semiconductor substrate 172, including source 174, drain 176, and channel 178, is substrate 72 (shown In FIG. 2). In one example, the layer of dielectric material 180 is made from oxide layer 74 (shown in FIG. 2).

First device 162 includes a first control terminal Control1 at drain 176 and a second control terminal Control2 at source 174. These control terminals are capacitively coupled to floating gate 166 via a control gate capacitance, also referred to as a control capacitance, that includes dielectric material 180 situated between floating gate 166 and substrate 172 over channel 178. A voltage at the control terminals Control1 and Control2 is coupled to floating gate 166 via the control capacitance.

The voltage at floating gate 166 is dependent upon the overlap capacitance of source 174 and drain 176. The overlap capacitance and the gate capacitance of first device 166 couple the voltage at first control terminal Control1 and second control terminal Control2 to floating gate 166. A standard EPROM uses the capacitance in the dielectric layer between the control gate and the floating gate to couple the voltage to the floating gate. In contrast, in gate-coupled EPROM cell 160, the gate to drain overlap capacitance at first control terminal Control1 couples the voltage at first control terminal Control1 to floating gate 166 and the gate to source overlap capacitance at second control terminal Control2 couples the voltage at second control terminal Control2 to floating gate 166. Dielectric material 180 is used in a reverse direction to provide the control capacitance.

Second device 164 includes semiconductor substrate 172 having source 182, drain 184, and channel 186, where channel 186 is situated between source 182 and drain 184. Floating gate 168 is situated over channel 186. Source 182 includes an N+ doped region and drain 184 includes an N+ doped region. Channel 186 is a p doped region situated between the N+ doped regions of source 182 and drain 184. A layer of dielectric material 188 is disposed between floating gate 168 and substrate 172 over channel 186. In one example, semiconductor substrate 172, including source 182, drain 184, and channel 186, is substrate 72 (shown In FIG. 2). In one example, the layer of dielectric material 188 is made from oxide layer 74 (shown in FIG. 2).

Channel 186 surrounds drain 184 and has a channel area and a channel length to width ratio. Floating gate 168 includes an active floating gate region that has an active floating gate region area and an active floating gate region length to width ratio. In one example, the active floating gate region area is smaller than the channel area. In one example, the active floating gate region length to width ratio is greater than the channel length to width ratio.

In one example, source 174 and drain 176 of first device 164 are electrically coupled together. In one example, source 174 of first device 164 is electrically coupled to drain 184 of second device 166. In one example, if a resistor is not needed to limit the drain current, e.g., by limiting overheating via controlling pulse width or by relying on the resistance of select transistors in an array, first control terminal Control1, second control terminal Control2, and drain 184 are all electrically coupled together, which provides a high level of coupling in a small area.

Alternatively, to limit drain current, drain 184 is electrically coupled to second control terminal Control2 and a resistor 190 (shown in dashed lines) electrically coupled between first control terminal Control1 and second control terminal Control2. In another approach, to limit drain current, source 174 is electrically coupled to drain 176 and a resistor 192 (shown in dashed lines) is electrically coupled between drain 184 and either source 174 or drain 176. In other examples, first control terminal 1 and second control terminal Control2 and drain 184 are electrically coupled to separate voltages.

To program EPROM cell 160, a high voltage bias is applied to drain 176 and source 174 of first device 162. This high voltage bias on drain 176 and source 174 generates energetic "hot" carriers or electrons and provides a quantity of hot electrons to floating gates 166 and 168. As electrons are pulled onto floating gates 166 and 168, the threshold voltage of second device 164, i.e., the voltage required to cause channel 186 to conduct current, increases. If enough electrons are pulled onto floating gates 166 and 168, the threshold voltage increases to a level above a specified threshold voltage and EPROM cell 160 substantially blocks current at the specified threshold voltage level, which changes the logic state of EPROM cell 160 from one logic value to the other logic value. Thus, EPROM cell 160 is programmed via hot carrier injection onto floating gates 166 and 168.

The time required for programming is a function of the voltage on floating gates 166 and 168, the quantity of hot electrons drawn to floating gates 166 and 168, the threshold voltage change desired, the total gate structure capacitance, and the thickness of dielectric layer 180, where the thickness of dielectric layer 180 determines the percentage of energetic hot electrons that reach floating gates 166 and 168. The voltage on floating gates 166 and 168 depends on the voltage on drain 176 and source 174 and the coupling ratio of substrate 172 to floating gates 166 and 168. In one example, the voltage on floating gates 166 and 168 is in the range of 5 to 12 volts. In one example, the thickness of dielectric layer 180 is about 700 Angstroms.

The quantity of hot electrons provided during programming is higher when programming is done with the voltage on drain 184 close to the breakdown voltage of second device 164, and with higher current. The breakdown voltage is the voltage at which second device 164 begins to conduct with the gate below the threshold voltage (gate at zero volts). In one example, EPROM cell 160 is programmed at a voltage of about 16 V, where second device 164 has a breakdown voltage of 15 Volts. In one example, EPROM cell 160 is programmed with a 25 mA current.

To read or sense the state of EPROM cell 160, the threshold voltage across EPROM cell 160 is detected and/or the on-resistance Ron is measured using a sensor (not shown). Reading or sensing the state of EPROM cell 160 can be done by setting the gate/drain voltage and measuring the corresponding current or by setting the current and measuring the voltage. The measured on-resistance Ron of EPROM cell 160 changes by a factor of about 2 from an un-programmed state to a programmed state.

Figure 6:
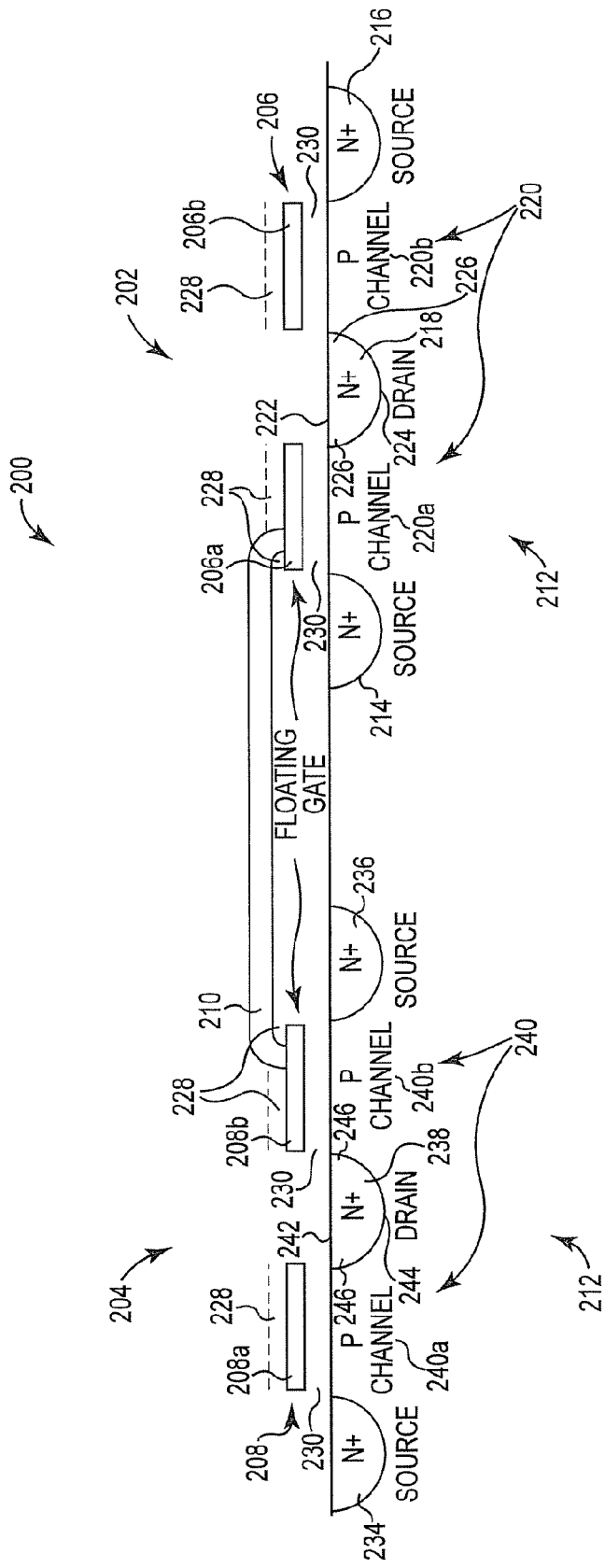
FIG. 6 is a diagram illustrating another example of a gate-coupled EPROM cell that uses the layers of the EPROM chip of FIG. 2.

FIG. 6 is a diagram illustrating one example of a gate-coupled EPROM cell 200 that uses the layers of EPROM chip 70 of FIG. 2. EPROM cell 200 is similar to EPROM cell 160 of FIG. 5. In one example, EPROM cell 20 of FIG. 1 is similar to EPROM cell 200. In one example, EPROM cell 200 is used in an inkjet printhead system. In one example, EPROM cell 200 is used in an inkjet control chip. In one example, EPROM cell 200 is used in an inkjet printhead die. In other examples, EPROM cell 200 is created using the layers of a different process.

EPROM cell 200 includes two devices 202 and 204 having their floating gates 206 and 208 electrically coupled together. First device 202 includes floating gate 206, which includes floating gate regions 206a and 206b, and second device 204 includes floating gate 208, which includes floating gate regions 208a and 208b. Floating gate 206 is electrically coupled to floating gate 208 via floating gate connection 210. First device 202 operates as a control gate and second device 204 provides the on-resistance Ron through EPROM cell 200. Floating gates 206 and 208 are made from polysilicon layer 76 (shown in FIG. 2) and floating gate connection 210 is made from metal 1 layer 80 (shown in FIG. 2).

First device 202 includes substrate 212 that has N+ source regions 214 and 216, an N+ drain region 218, and a p channel 220 that includes p channel regions 220a and 220b. Drain region 218 includes a top surface 222, a bottom 224, and sides 226 between top surface 222 and bottom 224. Channel 220, including channel regions 220a and 220b, surrounds drain region 218 around the sides 226 of drain region 218. Channel 220 is situated between source region 214 and drain region 218 and between source region 216 and drain region 218. Semiconductor substrate 212 is substrate 72 (shown In FIG. 2). In one example, source regions 214 and 216 are connected and part of one continuous source region that surrounds channel 220.

Channel 220 includes a closed curve structure around drain region 218, where a curve is defined as an object similar to a line, but not required to be straight, which entails that a line is a special case of a curve, namely a curve with null curvature. Also, a closed curve is defined as a curve that joins up and has no endpoints. In one example, channel 220 includes a rounded closed curve structure around drain region 218, where a rounded closed curve is a closed curve that has at least one rounded or arched corner or no corners, such that it does not have sharp or angled corners. In one example, channel 220, including channel regions 220a and 220b, is a rectangular shaped channel around drain region 218. In one example, channel 220, including channel regions 220a and 220b, is an elliptically shaped channel around drain region 218. In one example, channel 220, including channel regions 220a and 220b, is a circular shaped channel around drain region 218. In one example, channel 220, including channel regions 220a and 220b, has multiple straight sides and at least one rounded corner to form a rounded closed curve channel around drain region 218. In one example, channel 220, including channel regions 220a and 220b, has at least one rounded exterior corner to form a rounded closed curve channel around drain region 218. In one example, channel 220, including channel regions 220a and 220b, has at least one rounded exterior corner and at least one rectangular interior corner to form a rounded closed curve channel around drain region 218.

Floating gate 206 is formed in polysilicon layer 76, where floating gate 206 includes polysilicon floating gate regions 206a and 206b situated over channel regions 220a and 220b, respectively. A dielectric layer 228 is situated over floating gate 206, including floating gate regions 206a and 206b. A break or hole in dielectric layer 228, which is dielectric layer 78, allows floating gate connection 210 to be electrically coupled to floating gate 206, including floating gate regions 206a and 206b. Floating gate 206 is separated from substrate 212 by dielectric layer 230, which is oxide layer 74.

First device 202 includes a first control terminal Control1 at drain region 218 and a second control terminal Control2 at one or more of the source regions 214 and 216. These control terminals are capacitively coupled to floating gate 206 via a control gate capacitance, also referred to as a control capacitance, that includes dielectric layer 230 situated between floating gate 206 and substrate 212 over channel 220. A voltage at the control terminals Control1 and Control2 is coupled to floating gate 206 via the control capacitance. First device 202 and control terminals Control1 and Control2 are similar to control gate 32 (shown in FIG. 1).

The voltage at floating gate 206 depends on the overlap capacitance of source regions 214 and 216 and drain 218. The overlap capacitance and the gate capacitance of first device 202 couple the voltage at first control terminal Control1 and second control terminal Control2 to floating gate 206. In gate-coupled EPROM cell 200, the gate to drain overlap capacitance at first control terminal Control1 couples the voltage at first control terminal Control1 to floating gate 206 and the gate to source overlap capacitance at second control terminal Control2 couples the voltage at second control terminal Control2 to floating gate 206. Dielectric layer 230 is used in a reverse direction to provide the control capacitance.

Second device 204 includes substrate 212 that has N+ source regions 234 and 236, an N+ drain region 238, and a p channel 240 that includes p channel regions 240a and 240b. Drain region 238 includes a top surface 242, a bottom 244, and sides 246 between top surface 242 and bottom 244. Channel 240, including channel regions 240a and 240b, surrounds drain region 238 around the sides 246 of drain region 238. Channel 240 is situated between source region 234 and drain region 238 and between source region 236 and drain region 238. Semiconductor substrate 212 is substrate 72 (shown In FIG. 2). In one example, source regions 234 and 236 are connected and part of one continuous source region that surrounds channel 240.

Channel 240 includes a closed curve structure around drain region 238, where a curve is defined as an object similar to a line, but not required to be straight, which entails that a line is a special case of a curve, namely a curve with null curvature. Also, a closed curve is defined as a curve that joins up and has no endpoints. In one example, channel 240 includes a rounded closed curve structure around drain region 238, where a rounded closed curve is a closed curve that has at least one rounded or arched corner or no corners, such that it does not have sharp or angled corners. In one example, channel 240, including channel regions 240a and 240b, is a rectangular shaped channel around drain region 238. In one example, channel 240, including channel regions 240a and 240b, is an elliptically shaped channel around drain region 238. In one example, channel 240, including channel regions 240a and 240b, is a circular shaped channel around drain region 238. In one example, channel 240, including channel regions 240a and 240b, has multiple straight sides and at least one rounded corner to form a rounded closed curve channel around drain region 238. In one example, channel 240, including channel regions 240a and 240b, has at least one rounded exterior corner to form a rounded closed curve channel around drain region 238. In one example, channel 240, including channel regions 240a and 240b, has at least one rounded exterior corner and at least one rectangular interior corner to form a rounded closed curve channel around drain region 238.

Floating gate 208 is formed in polysilicon layer 76, where floating gate 208 includes polysilicon floating gate regions 208a and 208b situated over channel regions 240a and 240b, respectively. Dielectric layer 228 is situated over floating gate 208, including floating gate regions 208a and 208b. A break or hole in dielectric layer 228, which is dielectric layer 78, allows floating gate connection 210 to be electrically coupled to floating gate 208, including floating gate regions 208a and 208b. Floating gate 208 is separated from substrate 212 by dielectric layer 230, which is oxide layer 74.

Channel 240 surrounds drain region 238 and has a channel area and a channel length to width ratio. Floating gate 208 includes an active floating gate region that has an active floating gate region area and an active floating gate region length to width ratio. In one example, the active floating gate region area is smaller than the channel area. In one example, the active floating gate region length to width ratio is greater than the channel length to width ratio.

Source regions 214 and 216 and drain region 218 of first device 202 and drain region 238 of second device 204 can be electrically coupled to each other and to resistors as described for source 174 and drain 176 of first device 164 and drain 184 of second device 166 in EPROM cell 160 of FIG. 5.

To program EPROM cell 200, a high voltage bias is applied to drain region 218 and source regions 214 and 216 of first device 202. This high voltage bias on drain region 218 and source regions 214 and 216 generates energetic "hot" carriers or electrons and provides a quantity of hot electrons to floating gates 206 and 208. As electrons are pulled onto floating gates 206 and 208, the threshold voltage of second device 204, i.e., the voltage required to cause channel 240 to conduct current, increases. If enough electrons are pulled onto floating gates 206 and 208, the threshold voltage increases to a level above a specified threshold voltage and EPROM cell 200 substantially blocks current at the specified threshold voltage level, which changes the logic state of EPROM cell 200 from one logic value to the other logic value. Thus, EPROM cell 200 is programmed via hot carrier injection onto floating gates 206 and 208.

The time required for programming is a function of the voltage on floating gates 206 and 208, the quantity of hot electrons drawn to floating gates 206 and 208, the threshold voltage change desired, the total gate structure capacitance, and the thickness of dielectric layer 230, where the thickness of dielectric layer 230 determines the percentage of energetic hot electrons that reach floating gates 206 and 208. The voltage on floating gates 206 and 208 depends on the voltage on drain region 218 and source regions 214 and 216 and the coupling ratio of substrate 212 to floating gates 206 and 208. In one example, the voltage on floating gates 206 and 208 is in the range of 5 to 12 volts. In one example, the thickness of dielectric layer 230 is about 700 Angstroms.

The quantity of hot electrons provided during programming is higher when programming is done with the voltage on drain region 218 close to the breakdown voltage of second device 204, and with higher current. The breakdown voltage is the voltage at which second device 204 begins to conduct with the gate below the threshold voltage (gate at zero volts). In one example, EPROM cell 200 is programmed at a voltage of about 16 V, where second device 204 has a breakdown voltage of 15 Volts. In one example, EPROM cell 200 is programmed with a 25 mA current.

To read or sense the state of EPROM cell 200, the threshold voltage across EPROM cell 200 is detected and/or the on-resistance Ron is measured using a sensor (not shown). Reading or sensing the state of EPROM cell 200 can be done by setting the gate/drain voltage and measuring the corresponding current or by setting the current and measuring the voltage. The measured on-resistance Ron of EPROM cell 200 changes by a factor of about 2 from an un-programmed state to a programmed state.

Figure 7:
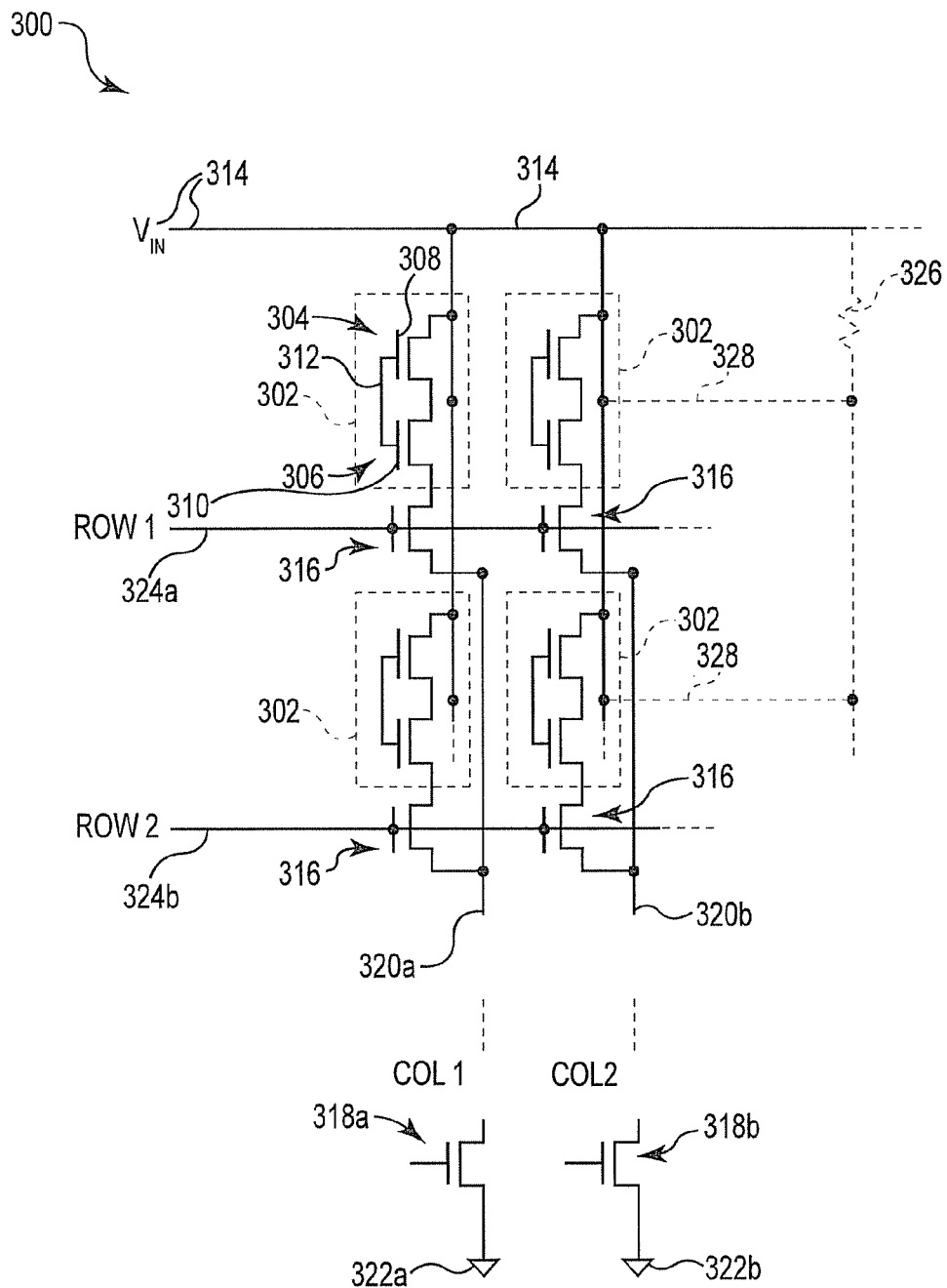
FIG. 7 is a diagram illustrating one example of an EPROM array including gate-coupled EPROM cells.

FIG. 7 is a diagram illustrating one example of an EPROM array 300 including gate-coupled EPROM cells 302 arranged in rows and columns. In one example, each of the EPROM cells 302 is similar to EPROM cell 20 of FIG. 1. In one example, each of the EPROM cells 302 is similar to EPROM cell 160 of FIG. 5. In one example, each of the EPROM cells 302 is similar to EPROM cell 200 of FIG. 6.

Each of the EPROM cells 302 includes a first device 304 that operates as a control gate and a second device 306 that provides the on-resistance Ron for the EPROM cell 302. First device 304 includes a floating gate 308, which is electrically coupled to a floating gate 310 of second device 306 via floating gate connection 312. The drain and source of first device 304 are electrically coupled to each other and to the drain of second device 306 and to input voltage Vin at 314. The source of second device 306 is electrically coupled to the drain of a row transistor 316, where the sources of row transistors 316 are electrically coupled to the drains of column transistors 318a and 318b via column lines 320a and 320b. The sources of column transistors 318a and 318b are electrically coupled to references at 322a and 322b, such as ground. Row transistors 316 and column transistors 318a and 318b provide selection of EPROM cells 302 for programming and reading.

Row lines 324a and 324b are electrically coupled to the gates of row transistors 316. Row line 324a provides row signal ROW1 at 324a to the gates of row transistors 316 in one row and row line 324b provides row signal ROW2 at 324b to the gates of row transistors 316 in another row. The sources of row transistors 316 in a given column are electrically coupled together and to the drain of one of the column transistors 318a and 318b that corresponds to the given column. The gates of each column transistor 318a and 318b are electrically coupled to a voltage source via column select lines (not shown).

Optionally, a drain current limiting resistor (not shown) can be added to each of the EPROM cells 302, as described with respect to FIG. 5. Also, rather than an individual resistor for each of the EPROM cells 302, a single resistor 326 (shown in dashed lines) can be provided to feed the EPROM cells 302 in parallel. Resistor 326 can be connected between the voltage Vin at 314 and the drain of the second device 306 in each of the EPROM cells 302, with a single line from Vin at 314 to resistor 326, and separate lines 328 (shown in dashed lines) extending from resistor 326 to the drain of the second device 306 in each of the EPROM cells 302 in the array, where the connection between the source and drain of the first device 304 in each of the EPROM cells 302 is then removed, and the drain of the first device 304 in each of the EPROM cells 302 electrically coupled to Vin at 314.

Each of the EPROM cells 302 is programmed via a high voltage bias applied to the drain and source of first device 304. This high voltage bias generates energetic "hot" carriers or electrons and provides a quantity of hot electrons to floating gates 308 and 310. The threshold voltage of second device 306 increases as electrons are pulled onto floating gates 308 and 310. If enough electrons are pulled onto floating gates 308 and 310, the threshold voltage increases to a level above a specified threshold voltage and the EPROM cell 302 changes logic states.

The time required for programming is a function of the voltage on floating gates 308 and 310, the quantity of hot electrons drawn to floating gates 308 and 310, the threshold voltage change desired, the total gate structure capacitance, and the thickness of the dielectric layer, where the thickness of the dielectric layer determines the percentage of energetic hot electrons that reach floating gates 308 and 310.

The quantity of hot electrons provided during programming is higher when programming is done with the voltage on the drain of the second device 306 close to the breakdown voltage of second device 306, and with higher current. In one example, each of the EPROM cells 302 is programmed at a voltage of about 16 V, where second device 306 has a breakdown voltage of 15 Volts. In one example, each of the EPROM cells 302 is programmed with a 25 mA current. To read or sense the state of each of the EPROM cells 302, the threshold voltage across the EPROM cell 302 is detected and/or the on-resistance Ron is measured using a sensor (not shown). Reading or sensing the state of an EPROM cell 302 can be done by setting the gate/drain voltage and measuring the corresponding current or by setting the current and measuring the voltage. The measured on-resistance Ron of the EPROM cell 302 changes by a factor of about 2 from an un-programmed state to a programmed state.

To program one of the EPROM cells 302, the EPROM cell 302 is selected by providing a row select voltage to one of the row lines 324a and 324b and a column select voltage to the gate of one of the column transistors 318a and 318b. Next, a relatively high input voltage Vin, such as 16V, is provided at 314. Only the selected EPROM cell 302 has substantially the full input voltage Vin across the EPROM cell 302. All other EPROM cells 302 have the source of the second device 306 floating to the voltages on the other terminals. To sense the state of a selected EPROM cell 302, a relatively low input voltage pulse Vin, such as 5V, is provided at 314 and the current through the selected EPROM cell 302 is monitored. In other examples, each EPROM cell 302 has a different control transistor coupled to it, where each EPROM cell 302 is selected via one control line coupled to the corresponding control transistor.

FIGS. 1, 3, 5, and 6 are diagrams illustrating examples of EPROM cells 20, 90, 160, and 200, respectively, that can be used to provide higher and tunable on-resistances Ron and increased control gate capacitance to floating gate capacitance ratios for improved EPROM performance and smaller standard deviations in the programmed on-resistance Ron. EPROM cells, such as EPROM cells 20, 90, 160, and 200, can be used in systems, such as inkjet printhead systems.

In inkjet printhead systems, EPROM cells, such as EPROM cells 20, 90, 160, and 200, can be used to store identification (ID) information. As smart features are added to printers and as security requirements increase, more EPROM cells are needed to store the related information. This ID information may include product type, serial number, ink drop weight, and customer loyalty/authentication information. However, increasing the number of EPROM cells on a printhead integrated circuit die, either reduces the amount of real estate available on the printhead die for other functions or it leads to increasing the size of the printhead die or both, which increases the cost of the printhead. To achieve higher information or bit densities, the EPROM cells can be encoded via individual and parallel addressing to obtain the equivalent of more than two states for each EPROM cell.

Figure 8:
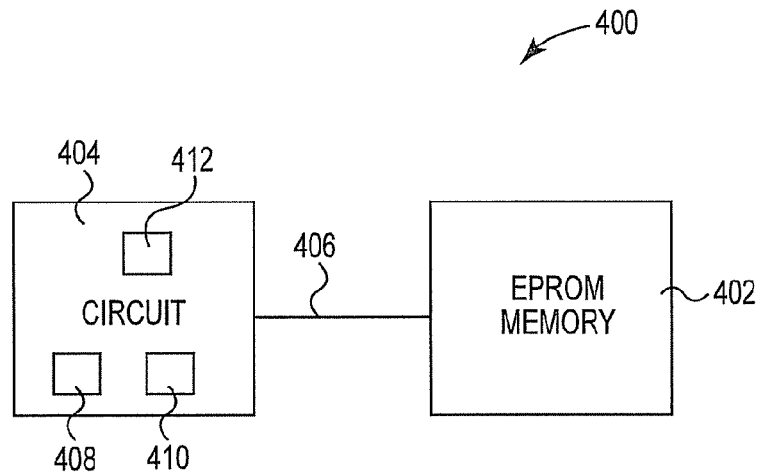
FIG. 8 is a diagram illustrating one example of a system that includes individual and parallel addressing of EPROM cells.

FIG. 8 is a diagram illustrating one example of a system 400 that includes individual and parallel addressing to obtain more than two states for each EPROM cell. System 400 includes an EPROM memory 402 and an associated circuit 404. EPROM memory 402 is communicatively coupled to circuit 404 via memory path 406. In one example, EPROM memory 402 is electrically coupled to circuit 404 via memory path 406. In one example, system 400 is part of an inkjet printhead system. In one example, system 400 is part of an inkjet control chip. In one example, system 400 is part of an inkjet printhead die.

EPROM memory 402 includes EPROM cells that can be selected and programmed individually and selected and read individually and in parallel combinations of the EPROM cells. In one example, each of the EPROM cells stores one of an un-programmed state and a programmed state. In one example, EPROM memory 402 includes EPROM cells similar to EPROM cell 20 of FIG. 1. In one example, EPROM memory 402 includes EPROM cells similar to EPROM cell 90 of FIG. 3. In one example, EPROM memory 402 includes EPROM cells similar to EPROM cell 160 of FIG. 5. In one example, EPROM memory 402 includes EPROM cells similar to EPROM cell 200 of FIG. 6.

Circuit 404 selects EPROM cells in EPROM memory 402 individually or in parallel combinations of EPROM cells to program and read the EPROM cells via memory path 406. Circuit 404 includes a programming circuit 408, a measurement circuit 410, and a voltage supply 412. To program an EPROM cell in EPROM memory 402, circuit 404 selects one of the EPROM cells and programming circuit 408 s voltage supply 412 to provide a programming voltage to the selected EPROM cell. To read EPROM memory 402, circuit 404 selects one of the EPROM cells individually or in a parallel combination of EPROM cells and measurement circuit 410 s voltage supply 412 to measure the on-resistance Ron of the selected EPROM cell or the selected parallel combination of EPROM cells. Circuit 404 assigns a corresponding state to the measured resistance value.

Figure 9:
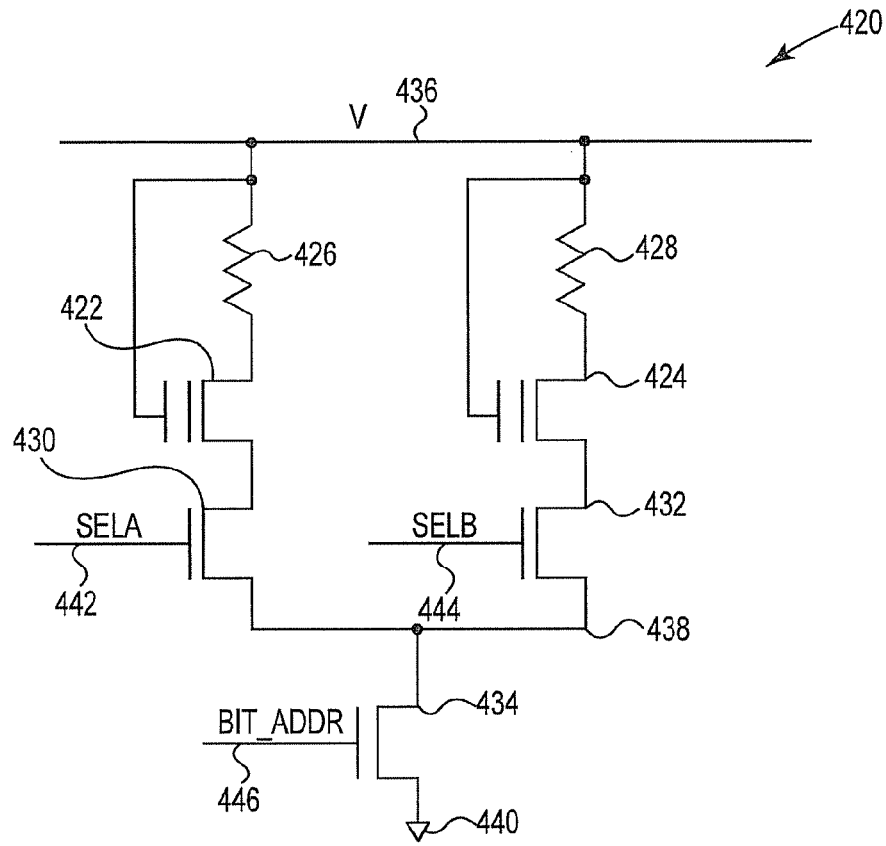
FIG. 9 is a diagram illustrating one example of an EPROM bit.

FIG. 9 is a diagram illustrating one example of an EPROM bit 420 in EPROM memory 402. EPROM bit 420 includes a first EPROM cell 422 and a second EPROM cell 424. Each of the first EPROM cell 422 and the second EPROM cell 424 has an un-programmed state and a programmed state, where each state of the first EPROM cell 422 and the second EPROM cell 424 has a different on-resistance value than the other three states. Circuit 404 (shown in FIG. 8) selects first EPROM cell 422 and second EPROM cell 424 individually or in parallel to program and read up to eight different states from EPROM bit 420. In one aspect, EPROM bit 420 is a multiple level (multilevel) EPROM bit 420. In another example, each of the first EPROM cell 422 and the second EPROM cell 424 has more than two states, where each state of the first EPROM cell 422 and the second EPROM cell 424 has a different on-resistance value than the other states of the first EPROM cell 422 and the second EPROM cell 424 and circuit 404 selects first EPROM cell 422 and second EPROM cell 424 individually or in parallel to program and read up to greater than eight states from EPROM bit 420. In other examples, EPROM bit 420 includes more than two EPROM cells, where each state of the more than two EPROM cells has a different on-resistance value than the other states of the more than two EPROM cells and circuit 404 selects the more than two EPROM cells individually or in parallel to program and read up to greater than eight different states from EPROM bit 420.

EPROM bit 420 includes a first resistor 426, a second resistor 428, first EPROM cell 422, second EPROM cell 424, a first select transistor 430, a second select transistor 432, and a bit address transistor 434. One end of first resistor 426 is electrically coupled to voltage supply 412 via voltage supply path 436 and the other end of first resistor 426 is electrically coupled to the drain of first EPROM cell 422. The gate of first EPROM cell 422 is electrically coupled to voltage supply 412 via voltage supply path 436 and the source of first EPROM cell 422 is electrically coupled to the drain of first select transistor 430. The source of first select transistor 430 is electrically coupled to the drain of bit address transistor 434 via drain path 438. The source of bit address transistor 434 is electrically coupled to a reference, such as ground, at 440. One end of second resistor 428 is electrically coupled to voltage supply 412 via voltage supply path 436 and the other end of second resistor 428 is electrically coupled to the drain of second EPROM cell 424. The gate of second EPROM cell 424 is electrically coupled to voltage supply 412 via voltage supply path 436 and the source of second EPROM cell 424 is electrically coupled to the drain of second select transistor 432. The source of second select transistor 432 is electrically coupled to the drain of bit address transistor 434 via drain path 438.

Each of the first EPROM cell 422 and the second EPROM cell 424 has an un-programmed state and a programmed state and each state of the first EPROM cell 422 and the second EPROM cell 424 has a different on-resistance than the other three states of the first EPROM cell 422 and the second EPROM cell 424. First EPROM cell 422 has a first un-programmed resistance and a first programmed resistance and second EPROM cell 424 has a second un-programmed resistance and a second programmed resistance, where each resistance of the first un-programmed resistance, the first programmed resistance, the second un-programmed resistance, and the second programmed resistance is a different resistance value than each of the other three resistances.

Circuit 404 (shown in FIG. 8) selects first EPROM cell 422 and second EPROM cell 424 individually or in parallel to program and read the states of EPROM bit 420. To select only first EPROM cell 422, circuit 404 simultaneously provides a high select signal SELA at 442, a low select signal SELB at 444, and a high bit address signal BIT_ADDR at 446. To select only second EPROM cell 424, circuit 404 simultaneously provides a low select signal SELA at 442, a high select signal SELB at 444, and a high bit address signal BIT_ADDR at 446. To select the parallel combination of the first EPROM cell 422 and the second EPROM cell 424, circuit 404 simultaneously provides a high select signal SELA at 442, a high select signal SELB at 444, and a high bit address signal BIT_ADDR at 446. In one example, circuit 404 combines row and column addresses to provide bit address signal BIT_ADDR at 446.

Circuit 404 programs first EPROM cell 422 and second EPROM cell 424 individually. To program first EPROM cell 422, circuit 404 selects only first EPROM cell 422 and programming circuit 408 s voltage supply 412 to provide a programming voltage V at 436 to first EPROM cell 422. Current flows through first resistor 426, first EPROM cell 422, first select transistor 430, and bit address transistor 434 to the reference at 440. To program second EPROM cell 424, circuit 404 selects only second EPROM cell 424 and programming circuit 408 s voltage supply 412 to provide a programming voltage V at 436 to second EPROM cell 424. Current flows through second resistor 428, second EPROM cell 424, second select transistor 432, and bit address transistor 434 to the reference at 440. Bit address transistor 434 conducts current from each of the first EPROM cell 422 and the second EPROM cell 424 via drain path 438. In other examples, circuit 404 can program first EPROM cell 422 and second EPROM cell 424 in parallel.

Circuit 404 reads EPROM bit 420 by selecting and reading first EPROM cell 422 and second EPROM cell 424 individually or in parallel. Circuit 404 selects one of the first EPROM cell 422, the second EPROM cell 424, and the parallel combination of the first EPROM cell 422 and the second EPROM cell 424, and measurement circuit 410 s voltage supply 412 to provide voltage V at 436. Measurement circuit 410 measures the on-resistance through the selected one of the first EPROM cell 422, the second EPROM cell 424, and the parallel combination of the first EPROM cell 422 and the second EPROM cell 424. Circuit 404 assigns a corresponding state to the measured resistance value.

EPROM bit 420 stores up to eight different states using first EPROM cell 422 and second EPROM cell 424, as shown in TABLE I.

TABLE I

| FIRST EPROM | SECOND EPROM | MEASURED RESISTANCE | STATE | RESISTANCE VALUES (Ohms) |
|---|---|---|---|---|
| Ra | X | Ra only | 0 | 3000 |
| Ra' | X | Ra' only | 1 | 6000 |
| X | Rb | Rb only | 2 | 4000 |
| X | Rb' | Rb' only | 3 | 7000 |
| Ra | Rb | Ra//Rb | 4 | 1714 |
| Ra | Rb' | Ra//Rb' | 5 | 2100 |
| Ra' | Rb | Ra'//Rb | 6 | 2400 |
| Ra' | Rb' | Ra'//Rb' | 7 | 3231 |

In operation, circuit 404 sets first EPROM cell 422 to one of a first un-programmed resistance Ra and a first programmed resistance Ra' and second EPROM cell 424 to one of a second un-programmed resistance Rb and a second programmed resistance Rb', where each resistance of the first un-programmed resistance Ra, the first programmed resistance Ra', the second un-programmed resistance Rb, and the second programmed resistance Rb' is different than each of the other three resistances.

States 0 and 1 are provided by only first EPROM cell 422. For state 0, first EPROM cell 422 is set to the first un-programmed resistance Ra and second EPROM cell 424 is set to either second un-programmed resistance Rb or second programmed resistance Rb'. For state 1, first EPROM cell 422 is set to the first programmed resistance Ra' and second EPROM cell 424 is set to either second un-programmed resistance Rb or second programmed resistance Rb'.

States 2 and 3 are provided by only second EPROM cell 424. For state 2, second EPROM cell 424 is set to second un-programmed resistance Rb and first EPROM cell 422 is set to either first un-programmed resistance Ra or first programmed resistance Ra'. For state 3, second EPROM cell 424 is set to second programmed resistance Rb' and first EPROM cell 422 is set to either first un-programmed resistance Ra or first programmed resistance Ra'.

States 4 through 7 are provided by the parallel combination of first EPROM cell 422 and second EPROM cell 424. For state 4, first EPROM cell 422 is set to first un-programmed resistance Ra and second EPROM cell 424 is set to second un-programmed resistance Rb. For state 5, first EPROM cell 422 is set to first un-programmed resistance Ra and second EPROM cell 424 is set to second programmed resistance Rb'. For state 6, first EPROM cell 422 is set to first programmed resistance Ra' and second EPROM cell 424 is set to second un-programmed resistance Rb. For state 7, first EPROM cell 422 is set to first programmed resistance Ra' and second EPROM cell 424 is set to second programmed resistance Rb'.

To read only first EPROM cell 422 for states 0 and 1, circuit 404 selects only first EPROM cell 422 and measurement circuit 410 s voltage supply 412 to provide voltage V to EPROM bit 420. Current flows through first resistor 426, first EPROM cell 422, first select transistor 430, and bit address transistor 434 to the reference at 440. Measurement circuit 410 measures the on-resistance Ron through first EPROM cell 422. The measured on-resistance Ron corresponds to one of the states of 0 and 1. The resistance values of states 0 and 1 depend on design and process variations. In the example illustrated in TABLE I, state 0 is 3000 Ohms and state 1 is 6000 Ohms. In other examples, states 0 and 1 are different resistance values.

To read only second EPROM cell 424 for states 2 and 3, circuit 404 selects only second EPROM cell 424 and measurement circuit 410 s voltage supply 412 to provide voltage V to EPROM bit 420. Current flows through second resistor 428, second EPROM cell 424, second select transistor 432, and bit address transistor 434 to the reference at 440. Measurement circuit 410 measures the on-resistance Ron through second EPROM cell 424. The measured on-resistance Ron corresponds to one of the states of 2 and 3. The resistance values of states 2 and 3 depend on design and process variations. In the example illustrated in TABLE I, state 2 is 4000 Ohms and state 3 is 7000 Ohms. In other examples, states 2 and 3 are different resistance values.

To read the parallel combination of the first EPROM cell 422 and the second EPROM cell 424, circuit 404 selects the parallel combination of the first EPROM cell 422 and the second EPROM cell 424 and measurement circuit 410 controls voltage supply 412 to provide voltage V to EPROM bit 420. Current flows through first resistor 426, first EPROM cell 422, first select transistor 430, and bit address transistor 434 to the reference at 440 and current flows through second resistor 428, second EPROM cell 424, second select transistor 432, and bit address transistor 434 to the reference at 440. The measured on-resistance Ron corresponds to one of the states of 4 through 7. The resistance values of states 4 through 7 depend on design and process variations. In the example illustrated in TABLE I, state 4 is 1714 Ohms, state 5 is 2100 Ohms, state 6 is 2400 Ohms, and state 7 is 3231 Ohms. In other examples, states 4 through 7 are different resistance values.

To read the different states of EPROM bit 420, a user has to know or obtain information that indicates whether to select only first EPROM cell 422 or only second EPROM cell 424 or the parallel combination of first EPROM cell 422 and second EPROM cell 424. This information is referred to as a coding scheme. In one example, at least part of the coding scheme is fixed and known by the user, such that each bit in a fixed portion of EPROM memory 402 is read by selecting only the first EPROM cell 422 or only the second EPROM cell 424 or only the parallel combinations of the EPROM cells 422 and 424. In one example, at least part of the coding scheme is stored in another EPROM memory or in another integrated circuit die. In one example, at least part of the coding scheme is stored on a central server that may be accessed over the internet. In one example, at least part of the coding scheme is stored in EPROM memory 402, such as in a select only the parallel combination portion of EPROM memory 402.

In EPROM bit 420, first EPROM cell 422 and second EPROM cell 424 have different on-resistances Ron. First EPROM cell 422 has a lower on-resistance Ron and second EPROM cell 424 has a higher on-resistance Ron. Different EPROM cell on-resistances Ron can be obtained by tuning the length and width of the channel in the device that provides the on-resistance Ron.

Figure 10:
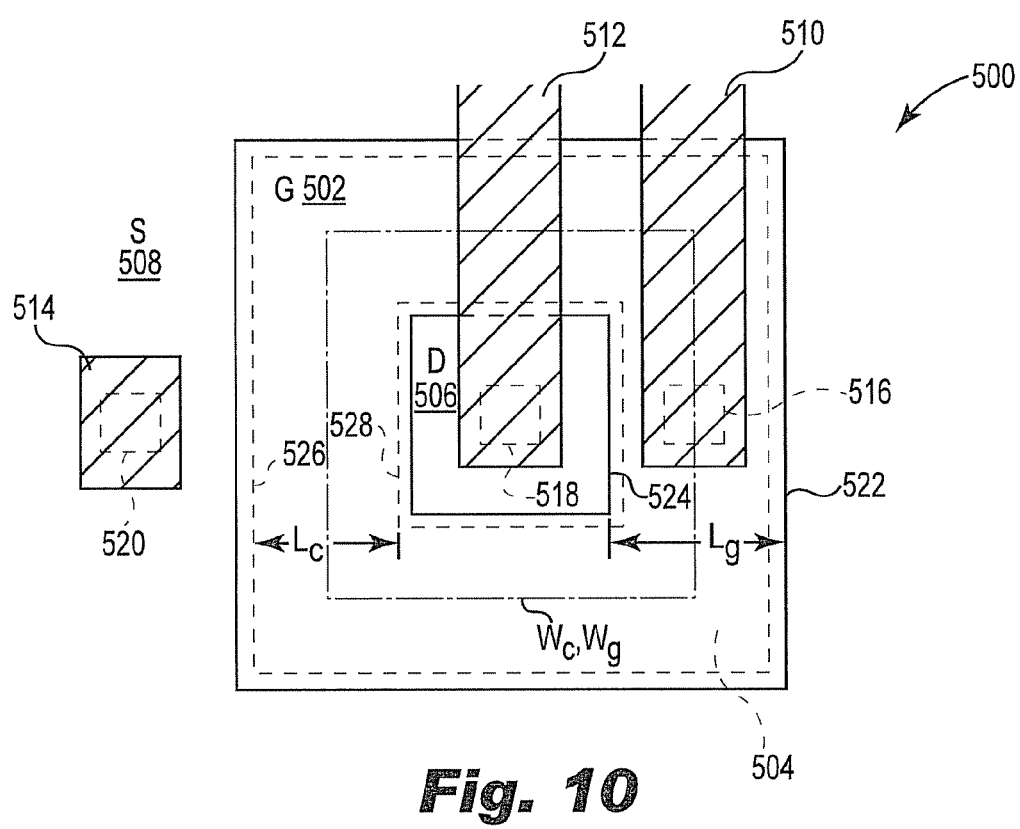
FIG. 10 is a top-view diagram illustrating one example of an EPROM cell that uses the layers of the EPROM chip of FIG. 2.

FIG. 10 is a top-view diagram illustrating one example of an EPROM cell 500 that uses the layers of EPROM chip 70 of FIG. 2. Some of the layers of EPROM cell 500, such as second dielectric layer 82 and metal 2 layer 84, are not shown for clarity in FIG. 10. EPROM cell 500 includes gate 502, channel 504 (indicated in dashed lines), drain region 506, and source region 508. Channel 504, drain region 506, and source region 508 are formed in semiconductor substrate 72 and gate 502 is formed in polysilicon layer 76. Gate 502 is separated from channel 504 by oxide layer 74. Channel 504 is situated under gate 502 and surrounds drain region 506. Channel 504 is situated between drain region 506 and source region 508, where source region 508 surrounds channel 504.

Gate lead 510, drain lead 512, and source lead 514 are formed in metal 1 layer 80. Gate lead 510 is connected to gate 502 through dielectric layer 78 via contact hole 516 (shown in dashed lines). Drain lead 512 is connected to drain region 506 through dielectric layer 78 via contact hole 518 (shown in dashed lines). Source lead 514 is connected to source region 508 through dielectric layer 78 via contact hole 520 (shown in dashed lines).

Gate 502 is a square shaped closed curve structure, which is a special case of a rectangular shaped closed curve structure. Gate 502 includes four sides and four right angle corners on each of the exterior side and the interior side. Gate 502 has a gate length Lg that is the distance from exterior side 522 of gate 502 to interior side 524 of gate 502. Gate 502 has a gate width Wg that is the distance around gate 502 as measured at the midpoint between the interior and exterior sides of gate 502. In one example, gate length Lg is the average gate length as measured at different points along the exterior and interior sides of gate 502. In one example, gate length Lg is an equivalent gate length that is used in circuit simulations. In one example, gate width Wg is the distance around gate 502 as measured at the exterior side of gate 502. In one example, gate width Wg is the distance around gate 502 as measured at the interior side of gate 502. In one example, gate width Wg is an equivalent gate width that is used in circuit simulations. In other examples, gate 502 can be another shape.

Channel 504 is also a square shaped closed curve structure, which is a special case of a rectangular shaped closed curve structure. Channel 504 includes four sides and four right angle corners. Channel 504 has a channel length Lc that is the distance from exterior side 526 of channel 504 to interior side 528 of channel 504. Channel 504 has a channel width Wc that is the distance around channel 504 as measured at the midpoint between the interior and exterior sides of channel 504, where channel width Wc is about the same as gate width Wg. In one example, channel length Lc is the average channel length as measured at different points along the exterior and interior sides of channel 504. In one example, channel length Lc is an equivalent channel length that is used in circuit simulations. In one example, channel width Wc is the distance around channel 504 as measured at the exterior side of channel 504. In one example, channel width Wc is the distance around channel 504 as measured at the interior side of channel 504. In one example, channel width Wc is an equivalent channel width that is used in circuit simulations. In other examples, channel 504 can be another shape.

In EPROM cell 500, substantially all of gate 502 is an active floating gate region and substantially all of channel 504 is an active channel region. The length to width ratio of the active channel region of channel 504 is equal to the length to width ratio of channel 504, which is Lc/Wc. Also, the length to width ratio of the active floating gate region of gate 502 is equal to the length to width ratio of gate 502, which is Lg/Wg.

One way of tuning and providing a higher on-resistance Ron in EPROM cell 500 is to increase the active floating gate region length to width ratio and the active channel region length to width ratio of the EPROM cell 500. However, decreases in channel width Wc are limited by process design rules and, in EPROM cells having closed curve channels, increasing channel length Lc increases channel width Wc, which limits the increase in the channel length to width ratio to about a factor of 4. In addition, increasing channel length Lc and channel width Wc increases the channel area, which decreases the control gate capacitance to floating gate capacitance ratio, decreasing EPROM performance and providing larger standard deviations in the programmed on-resistance Ron.

Another way of tuning and providing a higher on-resistance Ron in EPROM cell 500 is to etch away part of floating gate 502 to reduce the active floating gate region width and the active channel region width. This increases the active floating gate region length to width ratio and the active channel region length to width ratio, and tunes and increases the on-resistance Ron of EPROM cell 500. Also, reducing the active floating gate region width and the active channel region width, increases the control gate capacitance to floating gate capacitance ratio, which increases the performance of EPROM cell 500 and provides smaller standard deviations in the programmed on-resistance Ron.

Figure 11A:
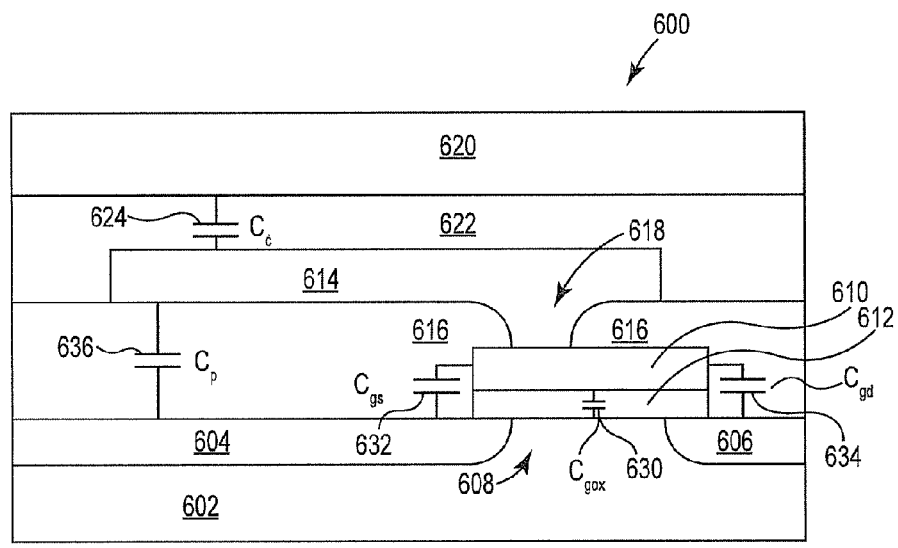
FIG. 11A is a diagram illustrating one example of the layers in an EPROM cell and the capacitances in the EPROM cell.
Figure 11B:
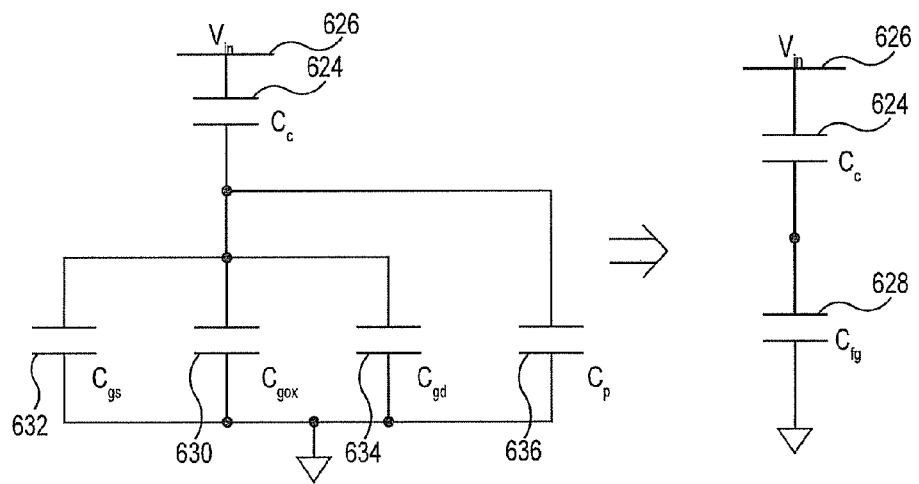
FIG. 11B is a diagram illustrating the capacitances of the EPROM cell of FIG. 11A.

FIGS. 11A and 11B are diagrams illustrating one example of an EPROM cell 600 and capacitances in EPROM cell 600. EPROM cell 600 uses the layers of EPROM chip 70 of FIG. 2. In one example, EPROM cell 600 is similar to EPROM cell 20 of FIG. 1. In one example, EPROM cell 600 is similar to EPROM cell 90 of FIG. 3. In one example, EPROM cell 600 is similar to EPROM cell 160 of FIG. 5. In one example, EPROM cell 600 is similar to EPROM cell 200 of FIG. 6. In one example, EPROM cell 600 is used in an inkjet printhead system. In one example, EPROM cell 600 is used in an inkjet control chip. In one example, EPROM cell 600 is used in an inkjet printhead die. In other examples, EPROM cell 600 is created using the layers of a different process.

EPROM cell 600 includes a substrate 602 that has an N+ source region 604, an N+ drain region 606, and a p channel 608. Source region 604, drain region 606, and channel 608 are formed in semiconductor substrate 72.

EPROM cell 600 also includes a floating gate 610 that is separated from channel 608 by an oxide layer 612. Floating gate 610 is formed in polysilicon layer 76 and oxide layer 612 is formed in oxide layer 74. Channel 608 is situated between source region 604 and drain region 606 and under floating gate 610.

Floating gate lead 614 is connected to floating gate 610 through dielectric layer 616 via a contact hole at 618. control gate 620 is separated from gate lead 614 via another dielectric layer 622. Dielectric layer 616 is formed in first dielectric layer 78, floating gate lead 614 is formed in metal 1 layer 80, the other dielectric layer 622 is formed in second dielectric layer 80, and control gate 620 is formed in metal 2 layer 84.

To program EPROM cell 600, a high input voltage pulse is applied to gate 620 and drain region 606, across drain region 606 to source region 604. This generates energetic "hot" carriers or electrons. A positive voltage bias between control gate 620 and drain region 606 pulls some of these hot electrons onto floating gate 610. As electrons are pulled onto floating gate 610, the threshold voltage of EPROM cell 600 increases, such that EPROM cell 600 is programmed via hot carrier injection onto floating gate 610.

To read or sense the state of EPROM cell 600, the threshold voltage is detected and/or the on-resistance Ron is measured using a sensor (not shown). Reading or sensing the state of EPROM cell 600 can be done by setting the gate/drain voltage and measuring the corresponding current or by setting the current and measuring the voltage. The measured on-resistance Ron of EPROM cell 600 changes by a factor of about 2 from an un-programmed state to a programmed state.

The on-resistance Ron of EPROM cell 600 corresponds to the effective gate voltage Vg_eff on floating gate lead 614 and on floating gate 610. The effective gate voltage Vg_eff is equal to the voltage transferred to the floating gate lead 614, referred to as the floating gate voltage Vg_float, minus the voltage drop due to negative charges or electrons trapped on the floating gate 610. Thus, the effective gate voltage Vg_eff depends on the number of electrons generated via hot carrier injection and trapped on floating gate 610, and the control gate capacitance to floating gate capacitance ratio, which determines the floating gate voltage Vg_float and the effectiveness of control gate 620 in ling EPROM cell 600.

EPROM cell 600 includes capacitive coupling between control gate 620 and floating gate lead 614, where control gate 620 and floating gate lead 614 form opposing capacitor plates of control gate capacitance Cc at 624. Input voltage Vin at 626 is applied to control gate 620 and capacitively coupled to floating gate lead 614 via control gate capacitance Cc at 624.

EPROM cell 600 includes capacitive coupling from floating gate lead 614 and floating gate 610 to substrate 602, where floating gate lead 614 and floating gate 610 form one capacitor plate and substrate 602 forms another capacitor plate in floating gate capacitance Cfg at 628.

A control gate capacitance Cc to floating gate capacitance Cfg ratio is shown in Equation I.

$$Cc/(Cc+Cfg) \quad \text{Equation I}$$

In Equation I, control gate capacitance Cc at 624 is the capacitance between control gate 620 and floating gate lead 614, and floating gate capacitance Cfg at 628 is the capacitance from floating gate lead 614 and floating gate 610 to substrate 602. Floating gate capacitance Cfg at 628 is further defined in Equation II.

$$Cfg=Cgox+Cgs+Cgd+Cp \quad \text{Equation II}$$

Where, the floating gate capacitance Cfg at 628 is equal to the gate oxide capacitance Cgox at 630 between floating gate 610 and channel 608 plus the gate to source overlap capacitance Cgs at 632 from floating gate 610 to source region 604 plus the gate to drain overlap capacitance Cgd at 634 from floating gate 610 to drain region 606 plus a parasitic capacitance Cp at 636 between floating gate lead 614 and substrate 602.

The gate oxide capacitance Cgox at 630 is the dominant capacitance in the floating gate capacitance Cfg at 628 and is shown in Equation III.

$$Cgox=(E*A)/Tox=(E*W*L)/Tox \quad \text{Equation III}$$

Where, E is the permittivity of oxide layer 612, Tox is the thickness of oxide layer 612, and L and W are the length and width, respectively, of channel 608 and substantially floating gate 610.

Reducing the length L and width W of channel 608 and floating gate 610, increases the control gate capacitance to floating gate capacitance ratio by reducing the gate oxide capacitance Cgox at 630 and the corresponding floating gate capacitance Cfg at 628. A higher control gate capacitance to floating gate capacitance ratio provides improved EPROM performance, smaller standard deviations in the programmed on-resistance Ron, and better control of the un-programmed versus programmed on-resistance Ron.

Also, different length L to width W ratios (L/W) of channel 608 and floating gate 610 in different EPROM cells result in different on-resistances Ron in the different EPROM cells. Where, for example, increasing the length to width ratio L/W increases the on-resistance Ron of EPROM cell 600 as shown via Equations IV and V.

$$Ron=1/(\lambda*Id) \quad \text{Equation IV}$$

In Equation IV, lamda ($\lambda$) is the channel length modulation parameter and Id is the drain current, which is proportional to the width to length ratio W/L of channel 608 and floating gate 610 as shown in Equation V.

$$Id=[(\mu n*Cox)/2]*(W/L)*(Vgs-Vth)^2 \quad \text{Equation V}$$

Where, mu μn is the charge-carrier effective mobility, Cox is the gate oxide capacitance per unit area, W is the gate width, L is the gate length, Vgs is the gate voltage, and Vth is the threshold voltage. Thus, the on-resistance Ron is inversely proportional to the drain current Id and proportional to the length to width ratio L/W, such that increasing the length to width ratio L/W increases the on-resistance Ron of EPROM cell 600.

To achieve higher control gate capacitance to floating gate capacitance ratios and different on-resistances Ron part of floating gate 610 is etched away to reduce the active floating gate region width and the active channel region width. This reduces the area of the active floating gate and the area of the active channel, and increases the active floating gate region length to width ratio L/W and the active channel region length to width ratio L/W, which increases the control gate capacitance to floating gate capacitance ratio and increases the on-resistance Ron of EPROM cell 600.

Figure 12A:
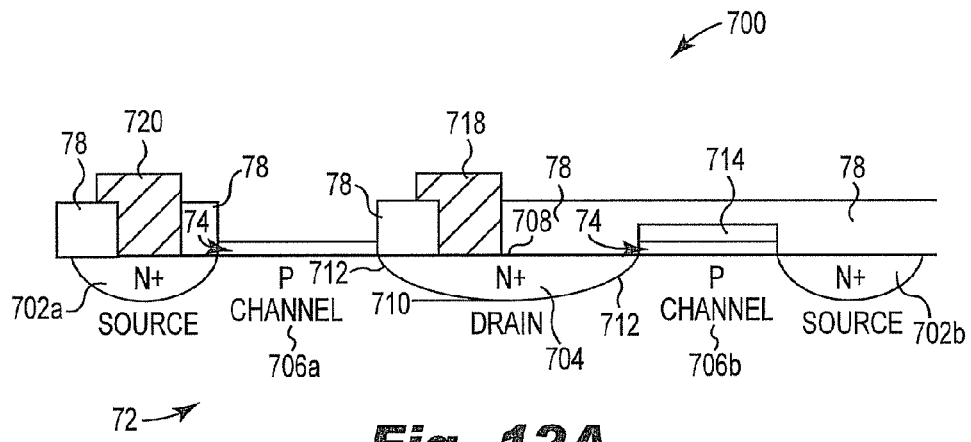
FIG. 12A is a cross-sectional diagram of an EPROM cell taken along the line A-A of FIG. 12B.
Figure 12B:
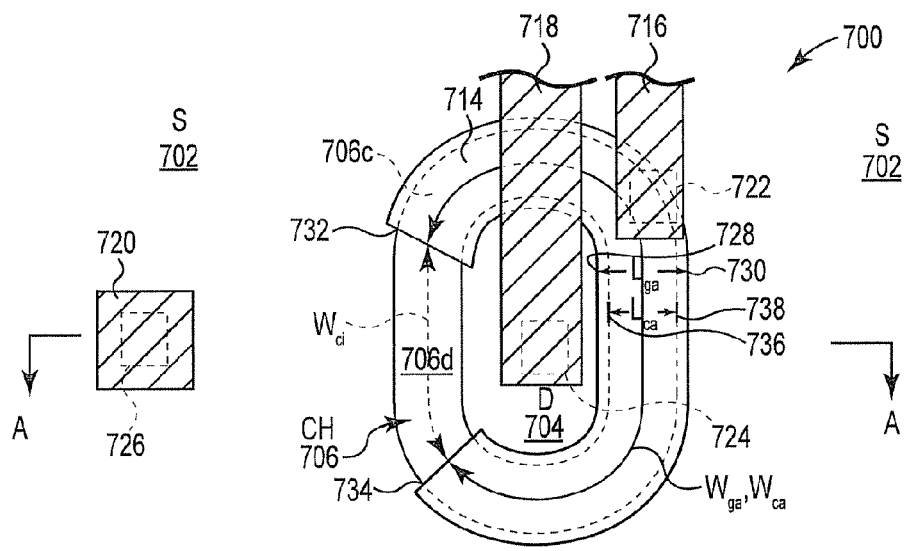
FIG. 12B is a top-view diagram illustrating one example of an EPROM cell.

FIGS. 12A and 12B are diagrams illustrating one example of an EPROM cell 700 configured to increase the control gate capacitance to floating gate capacitance ratio by reducing the area of the active floating gate and the area of the active channel, and configured to tune and increase the on-resistance Ron of EPROM cell 700 by increasing the active floating gate length to width ratio Lga/Wga and the active channel length to width ratio Lca/Wca. EPROM cell 700 uses the layers of EPROM chip 70 of FIG. 2, however, some of the layers of EPROM cell 700, such as second dielectric layer 82 and metal 2 layer 84, are not shown for clarity in FIGS. 12A and 12B.

FIG. 12A is a cross-sectional diagram of EPROM cell 700 taken along the line A-A of FIG. 12B. In one example, EPROM cell 700 is similar to EPROM cell 20 of FIG. 1. In one example, EPROM cell 700 is similar to EPROM cell 90 of FIG. 3. In one example, EPROM cell 700 is similar to EPROM cell 160 of FIG. 5. In one example, EPROM cell 700 is similar to EPROM cell 200 of FIG. 6. In one example, EPROM cell 700 is used in an inkjet printhead system. In one example, EPROM cell 700 is used in an inkjet control chip. In one example, EPROM cell 700 is used in an inkjet printhead die. In other examples, EPROM cell 700 is created using the layers of a different process.

EPROM cell 700 includes substrate 72 that has N+ source regions 702a and 702b, an N+ drain region 704, and a p channel 706 including p channel regions 706a and 706b. Drain region 704 includes a top surface 708, a bottom 710, and sides 712 between top surface 708 and bottom 710. Channel 706, including channel regions 706a and 706b, surrounds drain region 704 around the sides 712 of drain region 704. Channel 706 is situated between source region 702a and drain region 704 and between source region 702b and drain region 704. Source regions 702a and 702b are connected and part of one continuous source region 702 that surrounds channel 706.

Channel 706 includes a closed curve structure around drain region 704, where a curve is defined as an object similar to a line, but not required to be straight, which entails that a line is a special case of a curve, namely a curve with null curvature. Also, a closed curve is defined as a curve that joins up and has no endpoints. Channel 706, including channel regions 706a and 706b, is oblong. In other examples, channel 706, including channel regions 706a and 706b, can be a different shape, such as circular or rectangular, including square shaped.

A floating gate 714 (shown in FIG. 12B) is formed in polysilicon layer 76 over one portion of channel 706. This one portion of channel 706 is referred to as active channel region 706c (indicated with dashed lines under floating gate 714), which includes channel region 706b. Floating gate 714 is not situated over the other portion of channel 706, which is referred to as the inactive channel region 706d, which includes channel region 706a. Dielectric layer 74 is situated between floating gate 714 and substrate 72 in the active channel region 706c, including channel region 706b, and dielectric layer 74 is situated on substrate 72 in the inactive channel region 706d, including channel region 706a. In one example, dielectric layer 74 is a silicon dioxide layer.

Dielectric layer 78 is situated over floating gate 714, drain region 704, and source region 702, including source regions 702a and 702b. A contact mask is used to create vias or holes in dielectric layer 78. These holes are contact holes for floating gate 714, drain region 704, and source region 702 at 702a. Metal 1 layer 80 is disposed on dielectric layer 78 and etched to form floating gate lead 716, drain lead 718, and source lead 720. Floating gate lead 716 contacts floating gate 714 through the hole in dielectric layer 78, drain lead 718 contacts drain region 704 through the hole in dielectric layer 78, and source lead 720 contacts source region 702a through the hole in dielectric layer 78.

Floating gate 714 is a semi-oblong shaped floating gate having an active floating gate length Lga and an active floating gate width Wga. The active channel region 706c under floating gate 714 has an active channel length Lca and an active channel width Wca, where the active floating gate width Wga and the active channel width Wca are substantially the same. Also, channel 706 has an inactive channel width Wci, where the total channel width Wc is the sum of the active channel width Wca and the inactive channel width Wci. In other examples, floating gate 714 can be another shape, such as semi-circular or part of a rectangular shape, including part of a square shape.

In operation, to program EPROM cell 700, a high voltage bias or high input voltage pulse is applied to the control gate (not shown) and drain region 704, across drain region 704 to source region 702. Where, the control gate can be formed in second metal 84, such as control gate 108 (shown in FIG. 3), or a first device, such as first device 162 (shown in FIG. 5). This generates energetic "hot" carriers or electrons and provides a quantity of hot electrons onto floating gate 714. As electrons are pulled onto floating gate 714, the threshold voltage of EPROM cell 700, i.e., the voltage required to cause channel 706 to conduct current, increases. If enough electrons are pulled onto floating gate 714, the threshold voltage increases to a level above a specified threshold voltage and EPROM cell 700 substantially blocks current at a specified threshold voltage level, which changes the logic state of EPROM cell 700 from one logic value to the other logic value. Thus, EPROM cell 700 is programmed via hot carrier injection onto floating gate 714.

To read or sense the state of EPROM cell 700, the threshold voltage is detected and/or the on-resistance Ron is measured using a sensor (not shown). Reading or sensing the state of EPROM cell 700 can be done by setting the gate/drain voltage and measuring the corresponding current or by setting the current and measuring the voltage. The measured on-resistance Ron of EPROM cell 700 changes by a factor of about 2 from an un-programmed state to a programmed state.

FIG. 12B is a top-view diagram illustrating the example of EPROM cell 700. Some of the layers of EPROM cell 700 are not shown for clarity in FIG. 12B. As described above, EPROM cell 700 includes floating gate 714, channel 706, drain region 704, and source region 702. Active channel region 706c is situated under floating gate 714 and indicated by dashed lines. Channel 706 surrounds drain region 704 and is situated between drain region 704 and source region 702. Source region 702 surrounds channel 706.

Floating gate lead 716 is connected to floating gate 714 through dielectric layer 78 via contact hole 722 (shown in dashed lines). Drain lead 718 is connected to drain region 704 through dielectric layer 78 via contact hole 724 (shown in dashed lines). Source lead 720 is connected to source region 702 through dielectric layer 78 via contact hole 726 (shown in dashed lines).

Floating gate 714 is a semi-oblong shaped floating gate having an active floating gate length Lga that is the distance from one side 728 to the other side 730 of floating gate 714. Floating gate 714 has an active floating gate width Wga that is the distance from one end 732 to the other end 732 of floating gate 714. In one example, active floating gate length Lga is the average gate length as measured at different points along the sides of floating gate 714 that are next to drain region 704 and source region 702. In one example, active floating gate length Lga is an equivalent floating gate length that is used in circuit simulations. In other examples, floating gate 714 can be another shape.

Channel 706 includes active channel region 706c and inactive channel region 706d. Active channel region 706c is a semi-oblong shaped channel under floating gate 714. Active channel region 706c has an active channel length Lca that is the distance from one side 736 to the other side 738 of channel 706. Active channel region 706c has an active channel width Wca that is the distance from one end 732 to the other end 734 under floating gate 714, where the active floating gate width Wga and the active channel width Wca are substantially the same. Inactive channel region 706d has an inactive channel width Wci that is the other distance between the one end 732 and the other end 734. In one example, active channel length Lca is the average channel length as measured at different points along the sides of active channel region 706c, which are next to drain region 704 and source region 702. In one example, active channel length Lca is an equivalent channel length that is used in circuit simulations. In other examples, active channel region 706c can be another shape, such as semi-circular shaped or part of a rectangular shape, including part of a square shape.

Channel 706, including active channel region 706c and inactive channel region 706d, has a channel length Lc that is the distance from drain region 704 to source region 702. Channel 706, including active channel region 706c and inactive channel region 706d, has a channel width Wc that is the distance around channel 706 as measured at the midpoint between the interior and exterior sides of channel 706. The channel width Wc of channel 706, including active channel region 706c and inactive channel region 706d, is the sum of the active channel region width Wca and the inactive channel region width Wci. In one example, channel length Lc is the average channel length as measured at different points along the drain region 704 and source region 702. In one example, channel length Lc is an equivalent channel length that is used in circuit simulations. In one example, channel width Wc is the distance around channel 706 as measured at the exterior side of channel 706. In one example, channel width Wc is the distance around channel 706 as measured at the interior side of channel 706. In one example, channel width Wc is an equivalent channel width that is used in circuit simulations.

In EPROM cell 700, the active channel length Lca is substantially equal to the channel length Lc and the active channel width Wca is less than the channel width Wc. Thus, the area (Lca*Wca) of the active channel 706c is smaller than the area (Lc*Wc) of the channel 706 and the active channel length to width ratio Lca/Wca is greater than the channel length to width ratio Lc/Wc. Also, the active floating gate length Lga is substantially equal to the channel length Lc and the active floating gate width Wga is less than the channel width Wc. Thus, the area (Lga*Wga) of the active floating gate 714 is smaller than the area (Lc*Wc) of the channel 706 and the active floating gate length to width ratio Lga/Wga is greater than the channel length to width ratio Lc/Wc. Also, the area (Lga*Wga) of the active floating gate 714 is smaller than the area of a floating gate having the area (Lc*Wc) of channel 706 and the active floating gate length to width ratio Lga/Wga is greater than the length to width ratio of a floating gate having the length to width ratio Lc/Wc of channel 706.

Reducing the active floating gate area and the active channel area, increases the control gate capacitance to floating gate capacitance ratio, which increases the performance of EPROM cell 700 and provides smaller standard deviations in the programmed on-resistance Ron. Also, increasing the active floating gate region length to width ratio and the active channel region length to width ratio, tunes and increases the on-resistance Ron of EPROM cell 700. Using this methodology, the active floating gate region length to width ratio and the active channel length to width ratio can be increased beyond a factor of 4.

Figure 13:
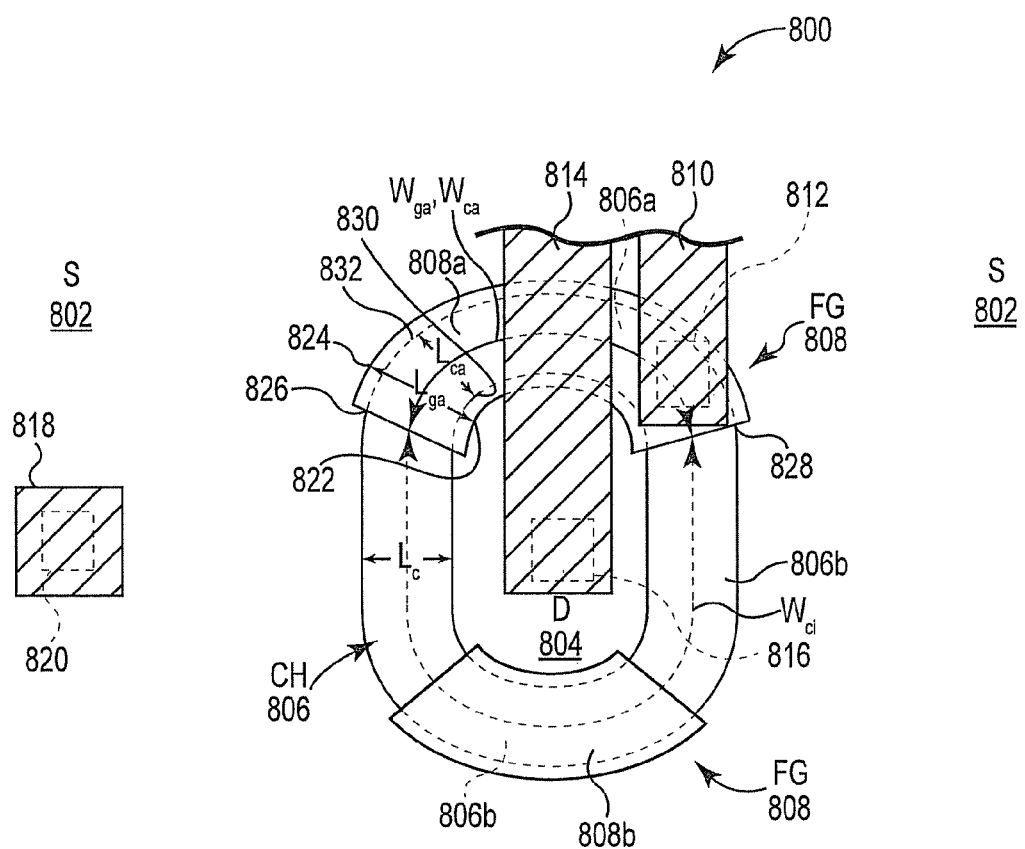
FIG. 13 is a top-view diagram illustrating one example of an EPROM cell having an active floating gate width and an active channel width that are each less than the channel width.

FIG. 13 is a top-view diagram illustrating the example of an EPROM cell 800 having an active floating gate width Wga and an active channel width Wca that are each less than the channel width Wc. EPROM cell 800 is configured to increase the control gate capacitance to floating gate capacitance ratio by reducing the area of the active floating gate and the area of the active channel, and configured to tune and increase the on-resistance Ron of EPROM cell 800 by increasing the active floating gate length to width ratio Lga/Wga and the active channel length to width ratio Lca/Wca. EPROM cell 800 uses the layers of EPROM chip 70 of FIG. 2, however, some of the layers of EPROM cell 800, such as second dielectric layer 82 and metal 2 layer 84, are not shown for clarity. In one example, EPROM cell 800 is similar to EPROM cell 20 of FIG. 1. In one example, EPROM cell 800 is similar to EPROM cell 90 of FIG. 3. In one example, EPROM cell 800 is similar to EPROM cell 160 of FIG. 5. In one example, EPROM cell 800 is similar to EPROM cell 200 of FIG. 6. In one example, EPROM cell 800 is used in an inkjet printhead system. In one example, EPROM cell 800 is used in an inkjet control chip. In one example, EPROM cell 800 is used in an inkjet printhead die. In other examples, EPROM cell 800 is created using the layers of a different process.

EPROM cell 800 includes an N+ source region 802, an N+ drain region 804, and a p channel 806 in substrate 72. Drain region 804 includes a top surface, a bottom, and sides between the top surface and the bottom. Channel 806 surrounds drain region 804 around the sides of drain region 804 and is situated between source region 802 and drain region 804. Source region 802 surrounds channel 806.

EPROM cell 800 includes a floating gate 808 having an active floating gate region 808a and an inactive floating gate region 808b. An active channel region 806a is situated under active floating gate region 808a and indicated by dashed lines. The rest of channel 806, i.e., channel 806 minus the active channel region 806a, is an inactive channel region 806b, including the inactive channel region 806b under inactive floating gate region 808b. Floating gate 808 is formed in polysilicon layer 76 and separated from channel 806 via oxide layer 74.

Floating gate lead 810 is connected to active floating gate region 808a through dielectric layer 78 via contact hole 812 (shown in dashed lines). Neither, floating gate lead 810 nor active floating gate region 808a is connected to inactive floating gate region 808b. Drain lead 814 is connected to drain region 804 through dielectric layer 78 via contact hole 816 (shown in dashed lines). Source lead 818 is connected to source region 802 through dielectric layer 78 via contact hole 820 (shown in dashed lines). Floating gate lead 810, drain lead 814, and source lead 818 are formed in metal 1 layer 80.

Active floating gate region 808a is a semi-circular or semi-oblong shaped floating gate region having an active floating gate length Lga that is the distance from one side 822 to the other side 824 of active floating gate region 808a. Active floating gate region 808a has an active floating gate width Wga that is the distance from one end 826 to the other end 828 of active floating gate region 808a. In one example, active floating gate length Lga is the average gate length as measured at different points along the sides of active floating gate region 808a that are next to drain region 804 and source region 802. In one example, active floating gate length Lga is an equivalent floating gate length that is used in circuit simulations. In other examples, active floating gate region 808a can be another shape, such as part of a circular shape or part of a rectangular shape, including part of a square shape.

Inactive floating gate region 808b is a semi-circular or semi-oblong shaped floating gate region that is not connected to floating gate lead 810 or active floating gate region 808a and, thus, remains inactive. Floating gate material previously between active floating gate region 808a and inactive floating gate region 808b has been removed, such that active floating gate region 808a is not connected to inactive floating gate region 808b. In other examples, inactive floating gate region 808b can be another shape, such as part of a circular shape or part of a rectangular shape, including part of a square shape.

Channel 806 includes active channel region 806a and inactive channel region 806b. Active channel region 806a is a semi-circular or semi-oblong shaped channel under active floating gate region 808a. Active channel region 806a has an active channel length Lca that is the distance from one side 830 to the other side 832 of channel 806. Active channel region 806a has an active channel width Wca that is the distance from the one end 826 to the other end 828 under active floating gate region 808a, where the active floating gate width Wga and the active channel width Wca are substantially the same. Inactive channel region 806b has an inactive channel width Wci that is the other distance between the one end 826 and the other end 828. In one example, active channel length Lca is the average channel length as measured at different points along the sides of active channel region 806a, which are next to drain region 804 and source region 802. In one example, active channel length Lca is an equivalent channel length that is used in circuit simulations. In other examples, active channel region 806a can be another shape, such as part of a circular shape or part of a rectangular shape, including part of a square shape.

Channel 806, including active channel region 806a and inactive channel region 806b, has a channel length Lc that is the distance from drain region 804 to source region 802. Channel 806, including active channel region 806a and inactive channel region 806b, has a channel width Wc that is the distance around channel 806 as measured at the midpoint between the interior and exterior sides of channel 806. The channel width Wc of channel 806, including active channel region 806a and inactive channel region 806b, is the sum of the active channel region width Wca and the inactive channel region width Wci. In one example, channel length Lc is the average channel length as measured at different points along the drain region 804 and source region 802. In one example, channel length Lc is an equivalent channel length that is used in circuit simulations. In one example, channel width Wc is the distance around channel 806 as measured at the exterior side of channel 806. In one example, channel width Wc is the distance around channel 806 as measured at the interior side of channel 806. In one example, channel width Wc is an equivalent channel width that is used in circuit simulations. In other examples, EPROM cell 800 includes multiple active and/or inactive floating gate regions and, corresponding, multiple active and/or inactive channel regions.

In EPROM cell 800, the active channel length Lca is substantially equal to the channel length Lc and the active channel width Wca is less than the channel width Wc. Thus, the area (Lca*Wca) of the active channel 806a is smaller than the area (Lc*Wc) of the channel 806 and the active channel length to width ratio Lca/Wca is greater than the channel length to width ratio Lc/Wc. Also, the active floating gate length Lga is substantially equal to the channel length Lc and the active floating gate width Wga is less than the channel width Wc. Thus, the area (Lga*Wga) of the active floating gate 808a is smaller than the area (Lc*Wc) of the channel 806 and the active floating gate length to width ratio Lga/Wga is greater than the channel length to width ratio Lc/Wc. Also, the area (Lga*Wga) of the active floating gate 808a is smaller than the area of a floating gate having the area (Lc*Wc) of channel 806 and the active floating gate length to width ratio Lga/Wga is greater than the length to width ratio of a floating gate having the length to width ratio Lc/Wc of channel 806.

Reducing the active floating gate area and the active channel area, increases the control gate capacitance to floating gate capacitance ratio, which increases the performance of EPROM cell 800 and provides smaller standard deviations in the programmed on-resistance Ron. Also, increasing the active floating gate region length to width ratio and the active channel region length to width ratio, tunes and increases the on-resistance Ron of EPROM cell 800. Using this methodology, the active floating gate region length to width ratio and the active channel length to width ratio can be increased beyond a factor of 4.

FIGS. 14A-14F are diagrams illustrating one example of a method of manufacturing an EPROM cell 900 having an active floating gate width Wga and an active channel width Wca that are each less than the channel width Wc. EPROM cell 900 is configured to increase the control gate capacitance to floating gate capacitance ratio by reducing the area of the active floating gate and the area of the active channel versus the area of the entire channel, and configured to tune and increase the on-resistance Ron of EPROM cell 900 by increasing the active floating gate length to width ratio Lga/Wga and the active channel length to width ratio Lca/Wca. EPROM cell 900 uses the layers of EPROM chip 70 of FIG. 2, however, some of the layers of EPROM cell 900, such as second dielectric layer 82 and metal 2 layer 84, are not shown for clarity. EPROM cell 900 is similar to EPROM cell 800 of FIG. 13. In one example, EPROM cell 900 is similar to EPROM cell 20 of FIG. 1. In one example, EPROM cell 900 is similar to EPROM cell 90 of FIG. 3. In one example, EPROM cell 900 is similar to EPROM cell 160 of FIG. 5. In one example, EPROM cell 900 is similar to EPROM cell 200 of FIG. 6. In one example, EPROM cell 900 is used in an inkjet printhead system. In one example, EPROM cell 900 is used in an inkjet control chip. In one example, EPROM cell 900 is used in an inkjet printhead die. In other examples, EPROM cell 900 is created using the layers of a different process.

Figure 14A:
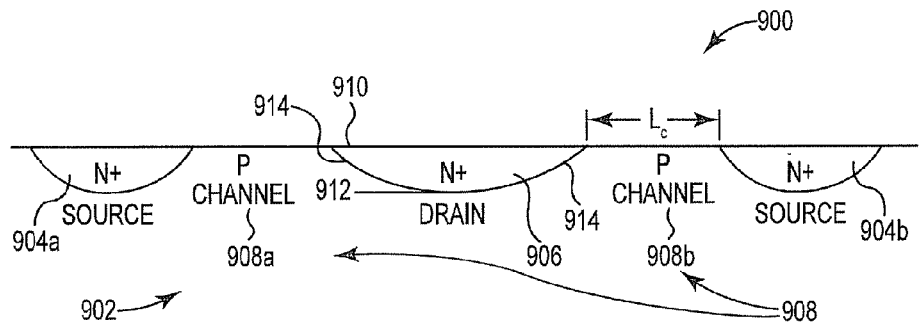
FIG. 14A is a diagram illustrating one example of a substrate that has a source region, a drain region, and a channel.

FIG. 14A is a diagram illustrating one example of a substrate 902 that has N+ source regions 904a and 904b, an N+ drain region 906, and a p channel 908 including p channel regions 908a and 908b. Drain region 906 includes a top surface 910, a bottom 912, and sides 914 between top surface 910 and bottom 912. Channel 908, including channel regions 908a and 908b, surrounds drain region 906 around the sides 914 of drain region 906. Channel 908 is situated between source region 904a and drain region 906 and between source region 904b and drain region 906. Source regions 904a and 904b are connected and part of one continuous source region 904 that surrounds channel 908.

Channel 908 includes a closed curve structure around drain region 906, where a curve is defined as an object similar to a line, but not required to be straight, which entails that a line is a special case of a curve, namely a curve with null curvature. Also, a closed curve is defined as a curve that joins up and has no endpoints. In one example, channel 908 surrounds drain region 906 with a uniform channel length Lc. In one example, channel 908 surrounds drain region 906 with a non-uniform channel length Lc. In one example, channel 908, including channel regions 908a and 908b, is square. In one example, channel 908, including channel regions 908a and 908b, is rectangular and not square. In one example, channel 908, including channel regions 908a and 908b, is oblong. In one example, channel 908, including channel regions 908a and 908b, has at least one rounded interior or exterior corner.

Figure 14B:
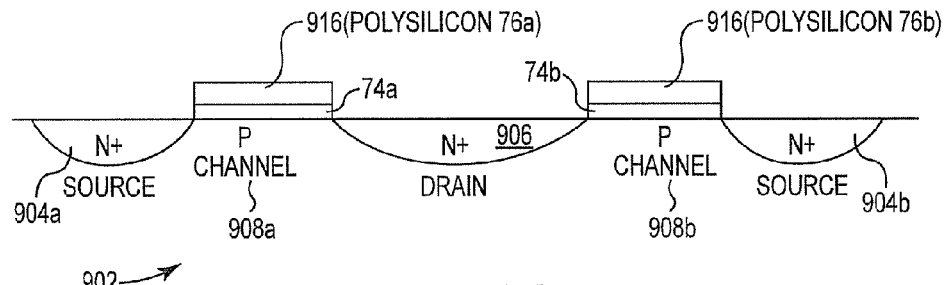
FIG. 14B is a diagram illustrating one example of a floating gate disposed over the channel.

FIG. 14B is a diagram illustrating one example of a floating gate 916 disposed over channel 908. Dielectric layer 74 is disposed on substrate 902 and polysilicon layer 76 is disposed on dielectric layer 74. Dielectric layer 74 is patterned to remain on channel 908 and includes dielectric layer 74a on channel region 908a and dielectric layer 74b on channel region 908b. Floating gate 916 is formed in polysilicon layer 76 and includes polysilicon gate regions 76a and 76b situated over channel regions 908a and 908b, respectively. Dielectric layer 74 is situated between floating gate 916 and substrate 902. In one example, dielectric layer 74 is a silicon dioxide layer. In one example, floating gate 916 is formed into the same shape as channel 908.

Figure 14C:
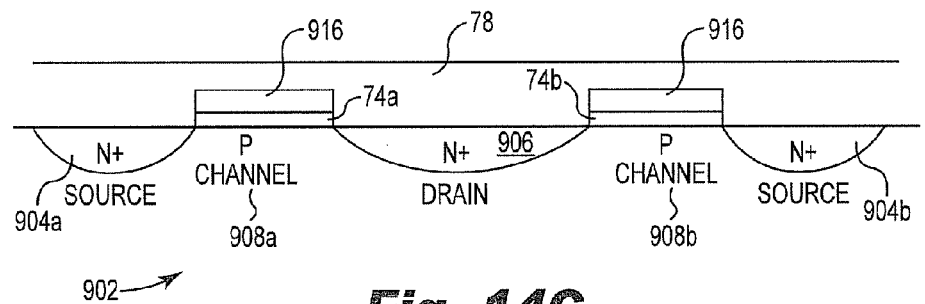
FIG. 14C is a diagram illustrating one example of a second dielectric layer disposed on the floating gate, the drain region, and the source region.

FIG. 14C is a diagram illustrating one example of a second dielectric layer 78 disposed on floating gate 916, drain region 906, and source region 904, including source regions 904a and 904b.

Figure 14D:
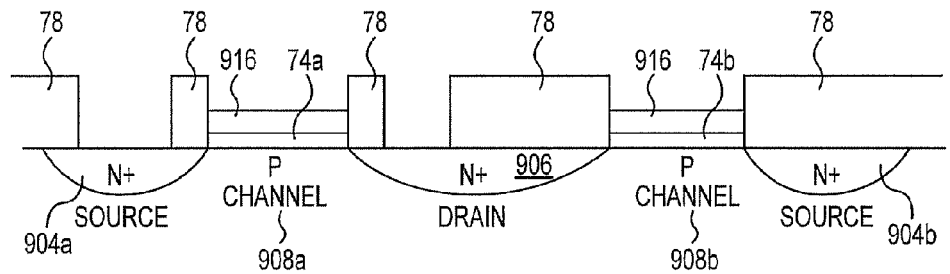
FIG. 14D is a diagram illustrating one example of an etched second dielectric layer.

FIG. 14D is a diagram illustrating one example of etched dielectric layer 78, after etching dielectric layer 78 via a contact mask to create holes in dielectric layer 78. Contact holes are etched in dielectric layer 78 to make contact to floating gate 916, drain region 906, and source region 904a. The contact hole for floating gate 916 is etched through dielectric layer 78 over the active channel region, such as active channel region 806a in EPROM cell 800. Dielectric layer 78 is also etched away via the contact mask over portions of floating gate 916 that are over an inactive channel region, such as inactive channel region 806b in EPROM cell 800. However, dielectric layer 78 is not etched away via the contact mask over the inactive floating gate region, such as inactive floating gate region 808b in EPROM cell 800.

Figure 14E:
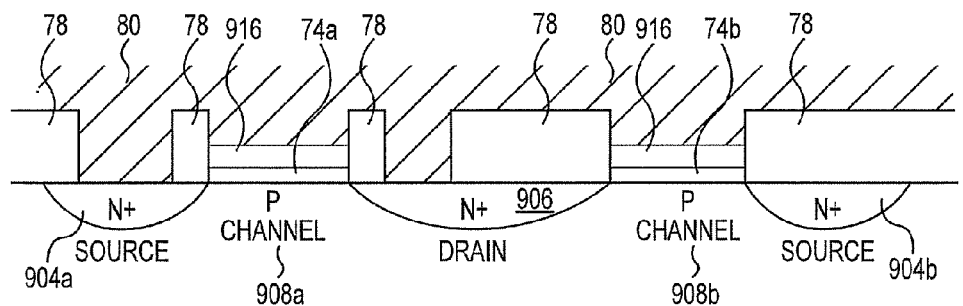
FIG. 14E is a diagram illustrating one example of a metal 1 layer disposed on the second dielectric layer, the floating gate, the drain region, and the source region.

FIG. 14E is a diagram illustrating one example of metal 1 layer 80 disposed on dielectric layer 78, floating gate 916, drain region 906, and source region 904. Metal 1 layer 80 contacts floating gate 916 through the floating gate contact hole. Also, metal 1 layer 80 contacts the floating gate 916 over the inactive channel region, such as inactive channel region 806b, not including the inactive floating gate region, such as inactive floating gate region 808b. Metal 1 layer 80 contacts drain region 906 through the drain contact hole and source region 904 through the source contact hole over source region 904a.

Figure 14F:
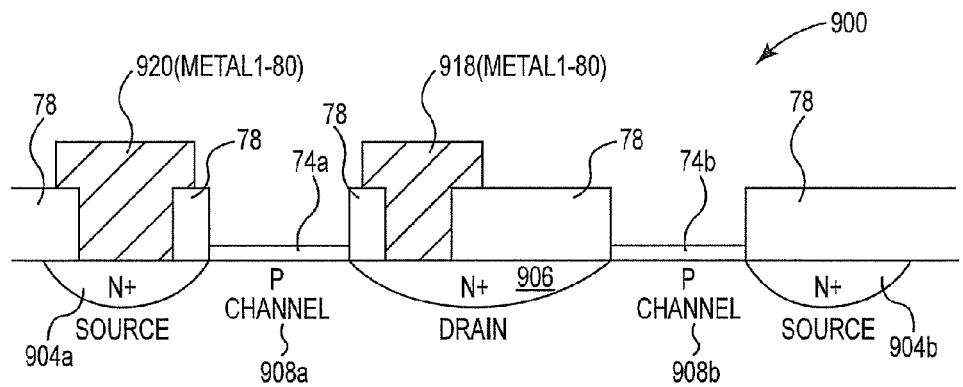
FIG. 14F is a diagram illustrating one example of the EPROM cell after etching the metal 1 layer to form a floating gate lead, a drain lead, and a source lead.

FIG. 14F is a diagram illustrating one example of EPROM cell 900 after etching metal 1 layer 80 to form a floating gate lead (not shown), drain lead 918, and source lead 920. Metal 1 layer 80 is etched away in areas that are unprotected in the photolithographic process, including over the active floating gate region, such as active floating gate region 808a, and the inactive floating gate region, such as inactive floating gate region 808b, down to dielectric layer 78. Metal 1 layer 80 and floating gate 916 are etched away over the inactive channel region, such as inactive channel region 806b, not including the inactive floating gate region, such as inactive floating gate region 808b, down to dielectric layer 74, including dielectric layers 74a and 74b.

The floating gate lead contacts the active floating gate region of floating gate 916 through the contact hole in dielectric layer 78 over the active channel region. Drain lead 918 contacts drain region 906 through the contact hole in dielectric layer 78, and source lead 920 contacts source region 904 through the contact hole in dielectric layer 78 over source region 904a.

Etching away metal 1 layer 80 and portions of floating gate 916 create the active floating gate region, such as active floating gate region 808a, the active channel region, such as active channel region 806a, the inactive floating gate region, such as inactive floating gate region 808b, and the inactive channel region, such as inactive channel region 806b. The area of the active channel region is smaller than the area of the channel, and the active channel length to width ratio is greater than the channel length to width ratio. Also, the area of the active floating gate region is smaller than the area of the channel and the active floating gate length to width ratio is greater than the channel length to width ratio. In addition, the area of the active floating gate is smaller than the area of the floating gate 916 prior to etching away metal 1 layer 80 and portions of floating gate 916, and the active floating gate length to width ratio is greater than the length to width ratio of the floating gate 916 prior to etching away metal 1 layer 80 and portions of floating gate 916.

Reducing the active floating gate area and the active channel area, increases the control gate capacitance to floating gate capacitance ratio, which increases the performance of EPROM cell 900 and provides smaller standard deviations in the programmed on-resistance Ron. Also, increasing the active floating gate region length to width ratio and the active channel region length to width ratio, tunes and increases the on-resistance Ron of EPROM cell 900.

Figure 15A:
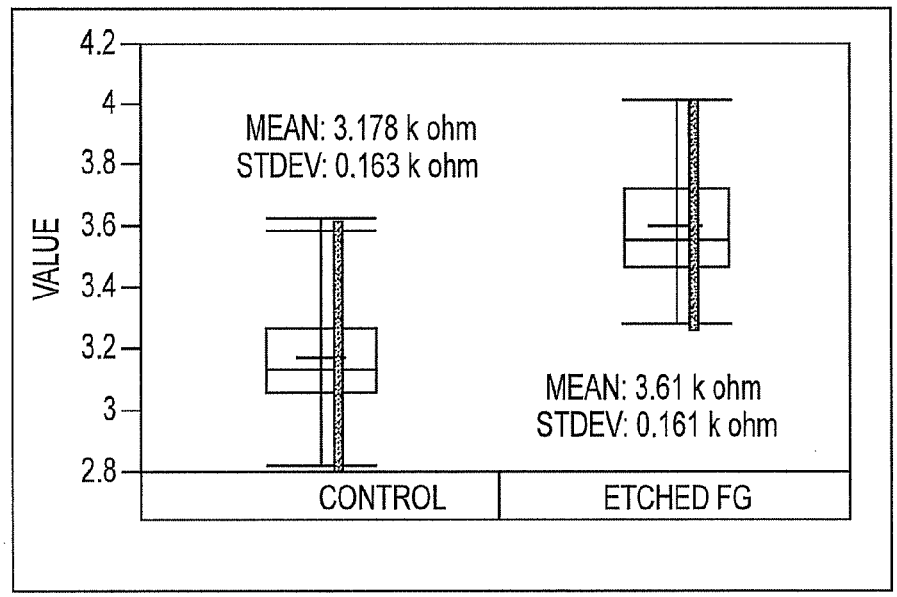
FIG. 15A is a diagram illustrating the on-resistances of EPROM cells that are un-programmed.
Figure 15B:
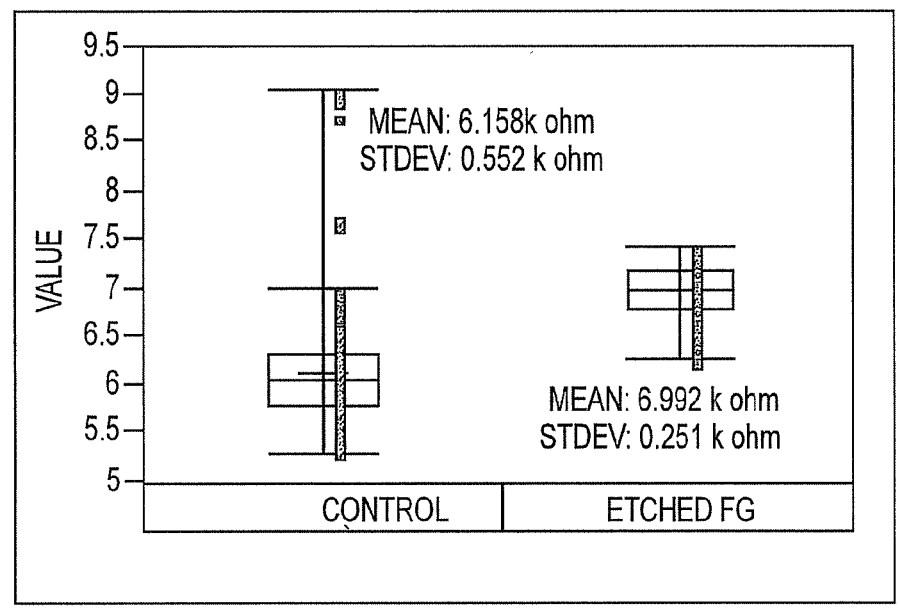
FIG. 15B is a diagram illustrating the on-resistances of EPROM cells that are programmed.

FIGS. 15A and 15B are diagrams illustrating the on-resistance Ron of EPROM cells having etched floating gates that result in active floating gate widths Wga and active channel widths Wca that are less than the corresponding channel widths Wc.

FIG. 15A is a diagram illustrating the on-resistances Ron of EPROM cells that are un-programmed, referred to herein as providing a logic 0 state. The control EPROM cells, which do not have etched floating gates, provide a mean on-resistance Ron of 3178 ohms with a standard deviation of 163 ohms. The etched floating gate EPROM cells provide a mean on-resistance Ron of 3610 ohms with a standard deviation of 161 ohms. Thus, the un-programmed on-resistance Ron of the etched floating gate EPROM cells is about 430 ohms more than the un-programmed on-Resistance of the control EPROM cells. The standard deviation remained about the same.

FIG. 15B is a diagram illustrating the on-resistances Ron of EPROM cells that are programmed, referred to herein as providing a logic 1 state. The EPROM cells, which do not have etched floating gates, provide a mean on-resistance Ron of 6158 ohms with a standard deviation of 552 ohms. The etched floating gate EPROM cells provide a mean on-resistance Ron of 6992 ohms with a standard deviation of 252 ohms. Thus, the programmed on-resistance Ron of the etched floating gate EPROM cells is about 830 ohms more than the programmed on-Resistance of the control EPROM cells, and the standard deviation of the on-resistance Ron of the etched floating gate EPROM cells is about 300 ohms less than the standard deviation of the on-resistance Ron of the control EPROM cells.

Reducing the active floating gate area and the active channel area, increased the control gate capacitance to floating gate capacitance ratio, which increased control over programming the etched floating gate EPROM cells and provided smaller standard deviations in the programmed on-resistance Ron. This leads to improved yields and lower die costs. Also, increasing the active floating gate region length to width ratio and the active channel region length to width ratio, increased the programmed and the un-programmed on-resistance Ron of the etched floating gate EPROM cells, which leads to different applications, such as multilevel programming via parallel addressing applications.

Figure 16:
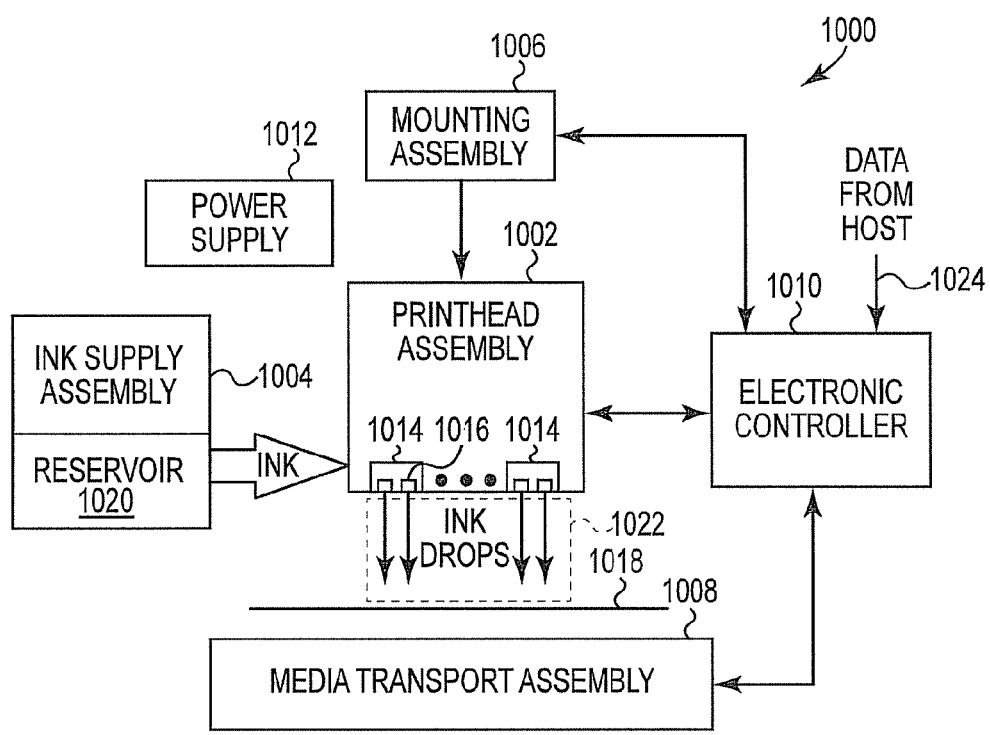
FIG. 16 is a diagram illustrating one example of an inkjet printing system.

FIG. 16 is a diagram illustrating one example of an inkjet printing system 1000 that includes EPROM cells having an active floating gate width Wga and an active channel width Wca that are each less than the channel width Wc.

Inkjet printing system 1000 constitutes one example of a fluid ejection system that includes a fluid ejection device, such as inkjet printhead assembly 1002, and a fluid supply assembly, such as ink supply assembly 1004. The inkjet printing system 1000 also includes a mounting assembly 1006, a media transport assembly 1008, and an electronic ler 1010. At least one power supply 1012 provides power to the various electrical components of inkjet printing system 1000.

In one example, inkjet printhead assembly 1002 includes at least one printhead or printhead die 1014 that ejects drops of ink through a plurality of orifices or nozzles 1016 toward a print medium 1018 so as to print onto print medium 1018. Printhead 1014 is one example of a fluid ejection device. Print medium 1018 may be any type of suitable sheet material, such as paper, card stock, transparencies, Mylar, fabric, and the like. Typically, nozzles 1016 are arranged in one or more columns or arrays such that properly sequenced ejection of ink from nozzles 1016 causes characters, symbols, and/or other graphics or images to be printed upon print medium 1018 as inkjet printhead assembly 1002 and print medium 1018 are moved relative to each other. While the following description refers to the ejection of ink from printhead assembly 1002, it is understood that other liquids, fluids or flowable materials, including clear fluid, may be ejected from printhead assembly 1002. In one example, at least one printhead 1014 includes EPROM memory and EPROM cells as described above.

Ink supply assembly 1004 as one example of a fluid supply assembly provides ink to printhead assembly 1002 and includes a reservoir 1020 for storing ink. As such, ink flows from reservoir 1020 to inkjet printhead assembly 1002. Ink supply assembly 1004 and inkjet printhead assembly 1002 can form either a one-way ink delivery system or a recirculating ink delivery system. In a one-way ink delivery system, substantially all of the ink provided to inkjet printhead assembly 1002 is consumed during printing. In a recirculating ink delivery system, only a portion of the ink provided to printhead assembly 1002 is consumed during printing. As such, ink not consumed during printing is returned to ink supply assembly 1004.

In one example, inkjet printhead assembly 1002 and ink supply assembly 1004 are housed together in an inkjet cartridge or pen. The inkjet cartridge or pen is one example of a fluid ejection device. In another example, ink supply assembly 1004 is separate from inkjet printhead assembly 1002 and provides ink to inkjet printhead assembly 1002 through an interface connection, such as a supply tube (not shown). In either example, reservoir 1020 of ink supply assembly 1004 may be removed, replaced, and/or refilled. In one example, where inkjet printhead assembly 1002 and ink supply assembly 1004 are housed together in an inkjet cartridge, reservoir 1020 includes a local reservoir located within the cartridge and may also include a larger reservoir located separately from the cartridge. As such, the separate, larger reservoir serves to refill the local reservoir. Accordingly, the separate, larger reservoir and/or the local reservoir may be removed, replaced, and/or refilled.

Mounting assembly 1006 positions inkjet printhead assembly 1002 relative to media transport assembly 1008 and media transport assembly 1008 positions print medium 1018 relative to inkjet printhead assembly 1002. Thus, a print zone 1022 is defined adjacent to nozzles 1016 in an area between inkjet printhead assembly 1002 and print medium 1018. In one example, inkjet printhead assembly 1002 is a scanning type printhead assembly. As such, mounting assembly 1006 includes a carriage (not shown) for moving inkjet printhead assembly 1002 relative to media transport assembly 1008 to scan print medium 1018. In another example, inkjet printhead assembly 1002 is a non-scanning type printhead assembly. As such, mounting assembly 1006 fixes inkjet printhead assembly 1002 at a prescribed position relative to media transport assembly 1008. Thus, media transport assembly 1008 positions print medium 1018 relative to inkjet printhead assembly 1002.

Electronic ler or printer ler 1010 typically includes a processor, firmware, and other electronics, or any combination thereof, for communicating with and ling inkjet printhead assembly 1002, mounting assembly 1006, and media transport assembly 1008. Electronic ler 1010 receives data 1024 from a host system, such as a computer, and usually includes memory for temporarily storing data 1024. Typically, data 1024 is sent to inkjet printing system 1000 along an electronic, infrared, optical, or other information transfer path. Data 1024 represents, for example, a document and/or file to be printed. As such, data 1024 forms a print job for inkjet printing system 1000 and includes one or more print job commands and/or command parameters. In one example, electronic ler 1010 includes EPROM memory including EPROM cells as described above.

In one example, electronic ler 1010 s inkjet printhead assembly 1002 for ejection of ink drops from nozzles 1016. As such, electronic ler 1010 defines a pattern of ejected ink drops that form characters, symbols, and/or other graphics or images on print medium 1018. The pattern of ejected ink drops is determined by the print job commands and/or command parameters.

In one example, inkjet printhead assembly 1002 includes one printhead 1014. In another example, inkjet printhead assembly 1002 is a wide-array or multi-head printhead assembly. In one wide-array example, inkjet printhead assembly 1002 includes a carrier, which carries printhead dies 1014, provides electrical communication between printhead dies 1014 and electronic ler 1010, and provides fluidic communication between printhead dies 1014 and ink supply assembly 1004.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device comprising:
    a drain;
    a channel that surrounds the drain and has a channel area;
    a floating gate that includes an active floating gate region that has an active floating gate region area; and
    a control gate coupled to the active floating gate region via a control capacitance, wherein the active floating gate region area is smaller than the channel area.

2. The device of claim 1, wherein the floating gate includes at least one inactive floating gate region.

3. The device of claim 1, wherein the floating gate has a floating gate capacitance and the active floating gate region has an active floating gate region capacitance and the control capacitance to the active floating gate region capacitance ratio is greater than the control capacitance to the floating gate capacitance ratio.

4. The device of claim 1, wherein the channel has a channel length to width ratio and the active floating gate region has an active floating gate region length to width ratio that is greater than the channel length to width ratio.

5. The device of claim 1, wherein the channel has a channel length to width ratio and the channel includes an active channel region that has an active channel region length to width ratio that is greater than the channel length to width ratio.

6. The device of claim 1, wherein the channel includes an active channel region that has an active channel region area that is greater than the channel area.

7. An integrated circuit comprising:
   a drain;
   a channel that surrounds the drain and has a channel length to width ratio;
   a floating gate that includes an active floating gate region having an active floating gate region length to width ratio; and
   a control gate coupled to the active floating gate region via a control capacitance, wherein the active floating gate region length to width ratio is greater than the channel length to width ratio.

8. The integrated circuit of claim 7, wherein the channel has a channel area and the active floating gate region has an active floating gate region area that is smaller than the channel area.

9. The integrated circuit of claim 7, wherein the control capacitance to active floating gate region capacitance ratio is greater than the control capacitance to floating gate capacitance ratio.

10. The integrated circuit of claim 7, wherein the floating gate includes at least one inactive floating gate region over an inactive channel region.

11. The integrated circuit of claim 7, wherein the channel includes an active channel region that has an active channel length to width ratio that is greater than the channel length to width ratio.

* * * * *